(12) United States Patent
Yamazaki

(10) Patent No.: US 8,866,233 B2
(45) Date of Patent: Oct. 21, 2014

(54) SEMICONDUCTOR DEVICE

(75) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 376 days.

(21) Appl. No.: 12/983,578

(22) Filed: Jan. 3, 2011

(65) Prior Publication Data

US 2011/0175104 A1 Jul. 21, 2011

(30) Foreign Application Priority Data

Jan. 15, 2010 (JP) ................. 2010-007421

(51) Int. Cl.
*H01L 27/11* (2006.01)
*H01L 27/12* (2006.01)
*H01L 21/84* (2006.01)

(52) U.S. Cl.
CPC ............ *H01L 21/84* (2013.01); *H01L 27/1207* (2013.01); *H01L 27/1225* (2013.01); *H01L 27/1229* (2013.01)
USPC ........... 257/379; 257/300; 257/306; 257/368; 257/E29.116; 257/E29.117; 257/E29.151; 257/E51.006; 257/E27.013; 438/241; 438/250; 349/43; 349/47; 349/48

(58) Field of Classification Search
CPC ................................... H01L 27/1229
USPC ............. 257/59, 72, 103, 187, 444, 300, 306, 257/368, 379, E27.013, E27.014, E27.016, 257/E27.017, E29.116, E29.117, E29.151, 257/E51.006; 438/152, 241, 250; 349/46, 349/47, 43, 48
See application file for complete search history.

(56) References Cited

U.S. PATENT DOCUMENTS

| | | | |
|---|---|---|---|
| 4,771,323 A | 9/1988 | Sasaki | |
| 4,864,374 A | 9/1989 | Banerjee | |
| 5,585,647 A * | 12/1996 | Nakajima et al. | ............... 257/72 |
| 5,731,856 A | 3/1998 | Kim et al. | |

(Continued)

FOREIGN PATENT DOCUMENTS

| | | |
|---|---|---|
| EP | 0253631 A2 | 1/1988 |
| EP | 1 737 044 A1 | 12/2006 |

(Continued)

OTHER PUBLICATIONS

Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

(Continued)

*Primary Examiner* — Kimberly Rizkallah
*Assistant Examiner* — Maria Ligai
(74) *Attorney, Agent, or Firm* — Fish & Richardson P.C.

(57) ABSTRACT

An object is to provide a semiconductor device having a novel structure which includes a combination of semiconductor elements with different characteristics and is capable of realizing higher integration. A semiconductor device includes a first transistor, which includes a first channel formation region including a first semiconductor material, and a first gate electrode, and a second transistor, which includes one of a second source electrode and a second drain electrode combined with the first gate electrode, and a second channel formation region including a second semiconductor material and electrically connected to the second source electrode and the second drain electrode.

24 Claims, 15 Drawing Sheets

(56) References Cited

U.S. PATENT DOCUMENTS

| | | |
|---|---|---|
| 5,744,864 A | 4/1998 | Cillessen et al. |
| 5,828,429 A | 10/1998 | Takemura |
| 5,886,388 A | 3/1999 | Wada et al. |
| 6,023,308 A | 2/2000 | Takemura |
| 6,127,702 A | 10/2000 | Yamazaki et al. |
| 6,294,274 B1 | 9/2001 | Kawazoe et al. |
| 6,563,174 B2 | 5/2003 | Kawasaki et al. |
| 6,576,943 B1 | 6/2003 | Ishii et al. |
| 6,693,301 B2 | 2/2004 | Takemura |
| 6,727,522 B1 | 4/2004 | Kawasaki et al. |
| 6,759,680 B1 | 7/2004 | Takemura |
| 6,787,835 B2 | 9/2004 | Atwood et al. |
| 6,876,023 B2 | 4/2005 | Ishii et al. |
| 6,949,782 B2 | 9/2005 | Atwood et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,071,910 B1 | 7/2006 | Takemura |
| 7,105,868 B2 | 9/2006 | Nause et al. |
| 7,116,302 B2 | 10/2006 | Takemura |
| 7,211,825 B2 | 5/2007 | Shih et al |
| 7,253,440 B1 | 8/2007 | Takemura |
| 7,282,782 B2 | 10/2007 | Hoffman et al. |
| 7,291,967 B2 | 11/2007 | Sakata et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,737,438 B2 | 6/2010 | Endo et al. |
| 7,825,406 B2 | 11/2010 | Yoshida et al. |
| 8,008,627 B2 | 8/2011 | Yaegashi et al. |
| 8,106,449 B2 | 1/2012 | Sano et al. |
| 8,530,246 B2 | 9/2013 | Ofuji et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0039670 A1 | 2/2005 | Hosono et al. |
| 2005/0127380 A1 | 6/2005 | Kawasaki et al. |
| 2005/0199959 A1 | 9/2005 | Chiang et al. |
| 2005/0205921 A1 | 9/2005 | Ishii et al. |
| 2005/0237786 A1 | 10/2005 | Atwood et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0259466 A1 | 11/2007 | Sakata et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0179598 A1* | 7/2008 | Kim et al. .................. 257/59 |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0303030 A1* | 12/2008 | Sakai et al. .................. 257/72 |
| 2009/0068773 A1 | 3/2009 | Lai et al. |
| 2009/0073325 A1 | 3/2009 | Kuwabara et al. |
| 2009/0078877 A1 | 3/2009 | Yaegashi et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0174835 A1* | 7/2009 | Lee et al. .................. 349/46 |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |

FOREIGN PATENT DOCUMENTS

| | | |
|---|---|---|
| EP | 2 226 847 A2 | 9/2010 |
| JP | 60-198861 A | 10/1985 |
| JP | 63019847 A | 1/1988 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-054572 A | 2/1990 |
| JP | 05-251705 A | 9/1993 |
| JP | 7092500 A | 4/1995 |
| JP | 07-176184 A | 7/1995 |
| JP | 08-264794 A | 10/1996 |
| JP | 10148848 A | 6/1998 |
| JP | 11045949 A | 2/1999 |
| JP | 11-505377 A | 5/1999 |
| JP | 2000-044236 A | 2/2000 |
| JP | 2000-150900 A | 5/2000 |
| JP | 2000-269457 A | 9/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-014094 A | 1/2004 |
| JP | 2004-103957 A | 4/2004 |
| JP | 2004-273614 A | 9/2004 |

(56) References Cited

FOREIGN PATENT DOCUMENTS

| JP | 2004-273732 A | 9/2004 |
|---|---|---|
| JP | 2007-081335 A | 3/2007 |
| JP | 2007-251104 A | 9/2007 |
| JP | 2008-072025 A | 3/2008 |
| JP | 2008-216529 A | 9/2008 |
| JP | 2009094465 A | 4/2009 |
| JP | 2009-277702 A | 11/2009 |
| JP | 2009540623 A | 11/2009 |
| JP | 2010-003910 A | 1/2010 |
| WO | 20041114391 A1 | 12/2004 |
| WO | 2008/145999 A1 | 12/2008 |
| WO | WO-2009/034953 | 3/2009 |
| WO | WO-2009/139482 | 11/2009 |

OTHER PUBLICATIONS

Kim, W et al., "An Experimental High-Density DRAM Cell with a Built-in Gain Stage," IEEE Journal of Solid-State Circuits, Aug. 1, 1994, vol. 29, No. 8, pp. 978-981.

Shukuri, S et al., "A Complementary Gain Cell Technology for Sub-1 V Supply DRAMs," IEDM 92: Technical Digest of International Electron Devices Meeting, Dec. 13, 1992, pp. 1006-1008.

Shukuri, S et al., "A Semi-Static Complementary Gain Cell Technology for Sub-1 V Supply Dram's," IEEE Transactions on Electron Devices, Jun. 1, 1994, vol. 41, No. 6, pp. 926-931.

International Search Report (Application No. PCT/JP2010/072727); dated Mar. 22, 2011; in English.

Written Opinion (Application No. PCT/JP2010/072727); dated Mar. 22, 2011; in English.

M.W.J. Prins et al.; "A ferroelectric transparent thin-film transistor"; Appl. Phys. Lett.; Jun. 17, 1996; pp. 3650-3652; vol. 68.

Masaki Nakamura et al.; "The Phase Relations in the In2O3-Ga2ZnO4-ZnO System at 1350°C."; J. Solid State Chem.; 1991; pp. 298-315; vol. 93.

Noboru Kimizuka et al.; Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System; J. Solid State Chem.; 1995; pp. 170-178; vol. 116.

Masaki Nakamura et al.; "Syntheses and crystal structures of new homologous compounds, indium iron zinc oxides (InFeO3(ZnO)m) (m: natural number) and related compounds"; Kotai Butsuri (Solid State Physics); 1993; pp. 317-327; vol. 28, No. 5.

Kenji Nomura et al.; "Thin-Film Transistor Fabricated in Single-Crystalline Transparent Oxide Semiconductor"; Science; 2003; pp. 1269-1272; vol. 300.

Kenji Nomura et al.; "Room-temperature fabrication of transparent flexible thin-film transistors using amorphous oxide semiconductors"; Nature; 2004; pp. 488-492; vol. 432.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZNO Thin-Film Transistors Produced At Room Temperature," Appl. Phys. Lett. (Applied Physics Letters), Sep. 27, 2004, vol. 85, No. 13, pp. 2541-2543

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZNO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214TH ECS Meeting, 2008, No. 2317, 1 page.

Kimizuka, N. et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] At Temperatures Over 1000°C," Journal of Solid State Chemistry, 1985, vol. 60, pp. 382-384.

Kitzerow, H et al., "Observation of Blue Phases in Chiral Networks," Liquid Crystals, 1993, vol. 14, No. 3, pp. 911-916.

(56) References Cited

OTHER PUBLICATIONS

Kurokawa, Y et al., "UHF RFCPUS on Flexible and Glass Substrates for Secure RFID Systems," Journal of Solid-State Circuits, 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13TH International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6TH International Display Workshops, Dec. 3, 2008, pp. 581-584.

Nakamura, "Synthesis of Homologous Compound with New Long-Period Structure," Nirim Newsletter, Mar. 1995, vol. 150, pp. 1-4 with English translation.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In-Ga-Zn-Oxide TFTS With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide Tfts and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZNO TFT," IMID '07 Digest, 2007, pp. 1249-1252.

Sakata, J et al., "Development of 4.0-IN. AMOLED Display With Driver Circuit Using Amorphous In-Ga-Zn-Oxide TFTS," IDW '09 : Proceedings of the 16TH International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15TH International Display Workshops, Dec. 3, 2008, pp. 1637-1640.

Tsuda, K et al., "Ultra Low Power Consumption Technologies for Mobile TFT-LCDs," IDW '02 : Proceedings of the 9TH International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

M.W.J. Prins et al.; "A ferroelectric transparent thin-film transistor"; Appl. Phys. Lett.; Jun. 17, 1996; vol. 68; No. 25; pp. 3650-3652.

Masaki Nakamura et al.; The Phase Relations in the In2O3-Ga2ZnO4-ZnO System at 1350°C; J. Solid State Chem.; 1991; vol. 93; No. 2; pp. 298-315.

Noboru Kimizuka et al.; Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System; J. Solid State Chem.; 1995; vol. 116; No. 1; pp. 170-178.

Kenji Nomura et al.; "Thin-Film Transistor Fabricated in Single-Crystalline Transparent Oxide Semiconductor"; Science; 2003; vol. 300; No. 5623; pp. 1269-1272.

* cited by examiner

SEMICONDUCTOR DEVICE

TECHNICAL FIELD

The invention disclosed herein relates to a semiconductor device including different semiconductor materials and a method for manufacturing the semiconductor device.

BACKGROUND ART

There are a wide variety of metal oxides and such metal oxides are used for various applications. Indium oxide is a well-known material and is used as a material for transparent electrodes which are needed for liquid crystal display devices or the like.

Some metal oxides have semiconductor characteristics. Examples of such metal oxides having semiconductor characteristics include tungsten oxide, tin oxide, indium oxide, zinc oxide, and the like. A thin film transistor in which a channel formation region is formed using such a metal oxide is already known (see, for example, Patent Documents 1 to 4, Non-Patent Document 1, and the like).

Examples of metal oxides include not only a single-component oxide but also a multi-component oxide. For example, $InGaO_3(ZnO)_m$ (m: natural number) having a homologous phase is known as a multi-component oxide semiconductor including In, Ga, and Zn (see, for example, Non-Patent Documents 2 to 4 and the like).

Furthermore, it is confirmed that an oxide semiconductor including such an In—Ga—Zn-based oxide can also be applied to a channel formation region of a thin film transistor (see, for example, Patent Document 5, Non-Patent Documents 5 and 6, and the like).

REFERENCES

Patent Documents

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957

Non-Patent Documents

[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor", *Appl. Phys. Lett.,* 17 Jun. 1996, Vol. 68, pp. 3650-3652
[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.,* 1991, Vol. 93, pp. 298-315
[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.,* 1995, Vol. 116, pp. 170-178
[Non-Patent Document 4] M. Nakamura, N. Kimizuka, T. Mohri, and M. Isobe, "Syntheses and crystal structures of new homologous compounds, indium iron zinc oxides ($InFeO_3(ZnO)_3$) (m: natural number) and related compounds", *KOTAI BUTSURI (SOLID STATE PHYSICS),* 1993, Vol. 28, No. 5, pp. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE,* 2003, Vol. 300, pp. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE,* 2004, Vol. 432, pp. 488-492

DISCLOSURE OF INVENTION

Characteristics of such a transistor including an oxide semiconductor as described above greatly differ from characteristics of a transistor including silicon which is conventional. Therefore, it is possible to propose a novel semiconductor device by utilizing a difference in characteristics between these transistors. In that case, because the transistor including an oxide semiconductor and the transistor including silicon are used in combination, an electrode of the transistor including an oxide semiconductor and an electrode of the transistor including silicon have a predetermined connection relationship.

In general, a method such as miniaturization of a transistor or an increase in integration of a semiconductor device is adopted in order to achieve an increase in operation speed of a semiconductor device, a reduction in power consumption of a semiconductor device, a reduction in price of a semiconductor device, or the like. The use of a combination of transistors including different materials is disadvantageous in terms of an increase in integration as compared to the use of only transistors including the same material because connection relationship thereof tends to be complex.

Thus, it is an object of an embodiment of the disclosed invention to provide a semiconductor device having a novel structure which includes a combination of semiconductor elements with different characteristics and is capable of realizing higher integration.

A semiconductor device according to the disclosed invention has a structure in which a gate electrode of a transistor including a first semiconductor material (e.g., a material other than an oxide semiconductor material (such as silicon)) is combined with a source electrode or a drain electrode of a transistor including a second semiconductor material (e.g., an oxide semiconductor material or the like). Examples of more specific structures are as follows.

An embodiment of the disclosed invention is a semiconductor device including a first transistor, which includes a first channel formation region including a first semiconductor material, impurity regions between which the first channel formation region is sandwiched, a first gate insulating layer over the first channel formation region, a first gate electrode over the first gate insulating layer, and a first source electrode and a first drain electrode electrically connected to the impurity regions, and a second transistor, which includes one of a second source electrode and a second drain electrode combined with the first gate electrode, the other of the second source electrode and the second drain electrode separated from the first gate electrode, a second channel formation region including a second semiconductor material and electrically connected to the second source electrode and the second drain electrode, a second gate insulating layer over the second channel formation region, and a second gate electrode over the second gate insulating layer.

An embodiment of the disclosed invention is a semiconductor device including a first transistor, which includes a first channel formation region including a first semiconductor material, impurity regions between which the first channel formation region is sandwiched, a first gate insulating layer over the first channel formation region, a first gate electrode over the first gate insulating layer, and a first source electrode and a first drain electrode electrically connected to the impurity regions, a second transistor, which includes one of a second source electrode and a second drain electrode combined with the first gate electrode, the other of the second source electrode and the second drain electrode separated from the first gate electrode, a second channel formation region including a second semiconductor material and electrically connected to the second source electrode and the second drain electrode, a second gate insulating layer over the second channel formation region, and a second gate electrode over the second gate insulating layer, and a capacitor, which includes one of the second source electrode and the second drain electrode, the second gate insulating layer, and a capacitor electrode over the second gate insulating layer.

An embodiment of the disclosed invention is a semiconductor device including a first transistor, which includes a first channel formation region including a first semiconductor material, impurity regions between which the first channel formation region is sandwiched, a first gate insulating layer over the first channel formation region, a first gate electrode over the first gate insulating layer, and a first source electrode and a first drain electrode electrically connected to the impurity regions, a second transistor, which includes one of a second source electrode and a second drain electrode combined with the first gate electrode, the other of the second source electrode and the second drain electrode separated from the first gate electrode, a second channel formation region including a second semiconductor material and electrically connected to the second source electrode and the second drain electrode, a second gate insulating layer over the second channel formation region, and a second gate electrode over the second gate insulating layer, and a capacitor, which includes one of the second source electrode and the second drain electrode, an oxide semiconductor layer partly including the second channel formation region, the second gate insulating layer, and a capacitor electrode over the second gate insulating layer.

In the above embodiments, the first semiconductor material can be a semiconductor material different from the second semiconductor material. In addition, the second semiconductor material may be an oxide semiconductor material.

Note that although, in the above embodiments, the channel formation region of the transistor may be formed using an oxide semiconductor material, the disclosed invention is not limited thereto. A material capable of realizing off-state current characteristics comparable to those of an oxide semiconductor material, for example, a widegap material (specifically, a semiconductor material having an energy gap Eg of more than 3 eV, for example), such as silicon carbide, or the like may be employed.

In addition, in the above embodiments, the switching speed of the first transistor can be higher than the switching speed of the second transistor. Furthermore, the off-state current of the second transistor can be smaller than the off-state current of the first transistor.

Note that the term such as "over" or "below" in this specification and the like does not necessarily mean that a component is placed "directly on" or "directly under" another component. For example, the expression "a gate electrode over a gate insulating layer" does not exclude the case where a component is placed between the gate insulating layer and the gate electrode. Moreover, the terms such as "over" and "below" are used only for convenience of description and can include the case where the vertical relationship of components is reversed, unless otherwise specified.

In addition, the term such as "electrode" or "wiring" in this specification and the like does not limit a function of a component. For example, an "electrode" can be used as part of a "wiring", and the "wiring" can be used as part of the "electrode". Furthermore, the term "electrode" or "wiring" can include the case where a plurality of "electrodes" or "wirings" is formed in an integrated manner.

Functions of a "source" and a "drain" are sometimes interchanged with each other when a transistor of opposite polarity is used or when the direction of current flowing is changed in circuit operation, for example. Therefore, the terms "source" and "drain" can be used to denote the drain and the source, respectively, in this specification.

Note that the term "electrically connected" in this specification and the like includes the case where components are connected through an "object having any electric function". There is no particular limitation on an object having any electric function as long as electric signals can be transmitted and received between components that are connected through the object.

Examples of an "object having any electric function" are a switching element such as a transistor, a resistor, an inductor, a capacitor, and an element with a variety of functions as well as an electrode and a wiring.

In a structure of the disclosed invention, a gate electrode of a transistor including a material other than an oxide semiconductor is combined with a source electrode or a drain electrode of a transistor including an oxide semiconductor. This makes it easier to realize higher integration even in a situation where the connection relationship is complex.

In addition, this makes it possible to realize higher integration of a semiconductor device having both a characteristic of a transistor including an oxide semiconductor, which is extremely small off-state current (leakage current between a source and a drain in an off state), and a characteristic of a transistor including a material other than an oxide semiconductor, which is capability for sufficiently high-speed operation.

In this manner, the disclosed invention provides a novel semiconductor device including a combination of a transistor including a material other than an oxide semiconductor and a transistor including an oxide semiconductor.

BRIEF DESCRIPTION OF DRAWINGS

FIGS. 2A-1, 2A-2, and 2B are cross-sectional views and a plan view of a semiconductor device.

FIGS. 3A-1, 3A-2, and 3B are cross-sectional views and a plan view of a semiconductor device.

FIGS. 6A-1 and 6A-2 are circuit diagrams of a semiconductor device.

BEST MODE FOR CARRYING OUT THE INVENTION

Figures 1, 1A:
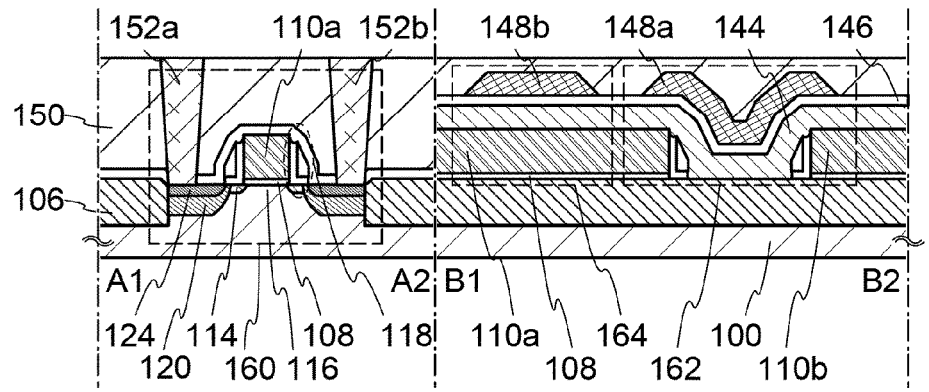
FIGS. 1A-1, 1A-2, and 1B are cross-sectional views and a plan view of a semiconductor device.

Examples of embodiments of the present invention will be described below with reference to the drawings. Note that the present invention is not limited to the following description and it will be readily appreciated by those skilled in the art that the modes and details of the present invention can be modified in various ways without departing from the spirit and the scope thereof. Therefore, the present invention should not be construed as being limited to the description in the following embodiments.

Note that the position, size, range, or the like of each component illustrated in drawings and the like is not accurately represented in some cases for easy understanding. Therefore, the disclosed invention is not necessarily limited to the position, size, range, or the like as disclosed in the drawings and the like.

Note that ordinal numbers such as "first", "second", and "third" in this specification and the like are used in order to avoid confusion among components, and the terms do not limit the components numerically.

Embodiment 1

In this embodiment, a structure and a manufacturing method of a semiconductor device according to one embodiment of the disclosed invention will be described with reference to FIGS. 1A-1, 1A-2, and 1B, FIGS. 2A-1, 2A-2, and 2B, FIGS. 3A-1, 3A-2, and 3B, FIGS. 4A to 4G, and FIGS. 5A to 5D.

<Structure of Semiconductor Device>

Figures 1, 1A, 2:
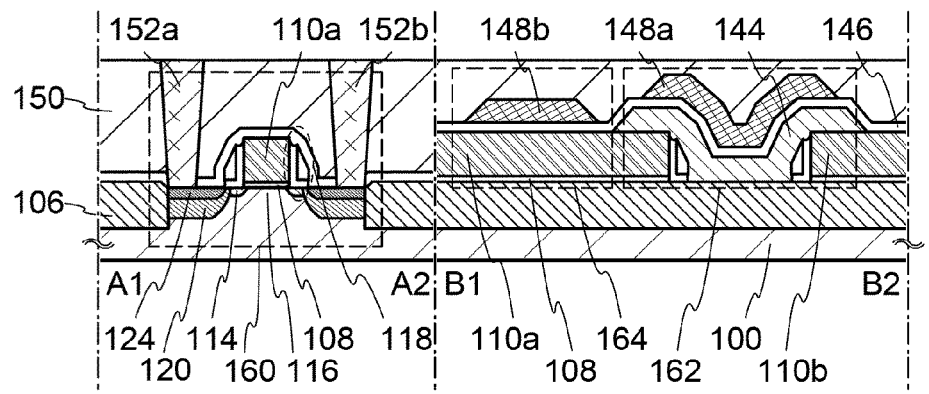
Figure 1B:
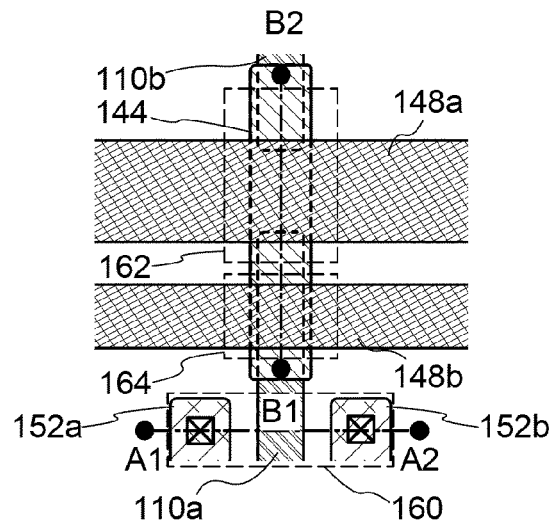

FIGS. 1A-1, 1A-2, and 1B illustrate an example of a structure of a semiconductor device. FIGS. 1A-1 and 1A-2 are cross-sectional views of the semiconductor device, and FIG. 1B is a plan view of the semiconductor device. Here, FIG. 1A-1 corresponds to a cross section along line A1-A2 and line B1-B2 in FIG. 1B. A plan view corresponding to FIG. 1A-2 is omitted here because it is similar to FIG. 1B except for part of the structure.

The semiconductor device illustrated in FIGS. 1A-1, 1A-2, and 1B includes a transistor 160 including a material other than an oxide semiconductor and a transistor 162 including an oxide semiconductor, and a gate electrode of the transistor 160 is combined with a source electrode or a drain electrode of the transistor 162. The semiconductor device also includes a capacitor 164 electrically connected to the gate electrode of the transistor 160 (also serving as the source electrode or drain electrode of the transistor 162). A transistor including a material other than an oxide semiconductor can operate at high speed easily. On the other hand, a transistor including an oxide semiconductor can hold charge for a long time owing to its characteristics. In particular, high integration can be easily achieved by employing a structure according to the disclosed invention. In addition, a manufacturing process can be simplified.

Although all the transistors described below are n-channel transistors, it is needless to say that p-channel transistors can be used. Since the technical nature of the disclosed invention is to use an oxide semiconductor in the transistor 162 so that data can be stored, it is not necessary to limit a specific structure of a semiconductor device to the structure described here.

The transistor 160 in FIGS. 1A-1, 1A-2, and 1B includes a channel formation region 116 provided in a substrate 100 including a semiconductor material (such as silicon), impurity regions 114 and high-concentration impurity regions 120 (these regions can be collectively referred to simply as impurity regions) provided such that the channel formation region 116 is sandwiched therebetween, a gate insulating layer 108 provided over the channel formation region 116, a gate electrode 110a provided over the gate insulating layer 108, and a source or drain electrode 152a and a source or drain electrode 152b electrically connected to the impurity regions.

Here, a sidewall insulating layer 118 is provided on a side surface of the gate electrode 110a. The high-concentration impurity regions 120 are provided in regions of the substrate 100 which do not overlap with the sidewall insulating layer 118 when seen from a direction perpendicular to a substrate surface. Metal compound regions 124 are provided in contact with the high-concentration impurity regions 120. An element isolation insulating layer 106 is provided over the substrate 100 so as to surround the transistor 160. The source or drain electrode 152a and the source or drain electrode 152b are electrically connected to the metal compound regions 124 through openings formed in a gate insulating layer 146 of the transistor 162 and an interlayer insulating layer 150. In other words, the source or drain electrode 152a and the source or drain electrode 152b are electrically connected to the high-concentration impurity regions 120 and the impurity regions 114 through the metal compound regions 124. Note that in some cases, the sidewall insulating layer 118 is not formed, in order to achieve higher integration of the transistor 160 or the like. In addition, in some cases, an interlayer insulating layer is provided so as to cover an upper portion of the transistor 160.

The transistor 162 in FIGS. 1A-1, 1A-2, and 1B includes the gate electrode 110a (or part thereof) of the transistor 160 as a component. The gate electrode 110a functions as one of a source electrode and a drain electrode in the transistor 162. In other words, the gate electrode of the transistor 160 is combined with one of the source electrode and the drain electrode of the transistor 162.

The transistor 162 also includes a source or drain electrode 110b. In addition, an oxide semiconductor layer 144 including a channel formation region is electrically connected to the gate electrode 110a and the source or drain electrode 110b. In other words, the source electrode and the drain electrode of the transistor 162 are electrically connected to the channel formation region of the transistor 162.

In addition, the transistor 162 includes a gate insulating layer 146 over the oxide semiconductor layer 144 including the channel formation region, and a gate electrode 148a over the gate insulating layer 146. Note that an interlayer insulating layer may be provided so as to cover an upper portion of the transistor 162.

Here, the oxide semiconductor layer 144 is preferably an oxide semiconductor layer which is purified by sufficiently removing an impurity such as hydrogen therefrom or by sufficiently supplying oxygen thereto. Specifically, the hydrogen concentration of the oxide semiconductor layer 144 is $5 \times 10^{19}$ atoms/cm$^3$ or less, preferably $5 \times 10^{18}$ atoms/cm$^3$ or less, more preferably $5 \times 10^{17}$ atoms/cm$^3$ or less, for example. Note that the above hydrogen concentration of the oxide semiconductor layer 144 is measured by secondary ion mass spectrometry (SIMS). The carrier concentration of the oxide semiconductor layer 144 in which hydrogen is reduced to a sufficiently low concentration and defect states in an energy gap due to oxygen deficiency are reduced by sufficiently supplying oxygen as described above is less than $1 \times 10^{12}$/cm$^3$, preferably less than $1 \times 10^{11}$/cm$^3$, more preferably less than $1.45 \times 10^{10}$/cm$^3$. For example, the off-state current (per unit channel width (1 μm), here) at room temperature is 100 zA/μm (1 zA (zeptoampere) is $1 \times 10^{-21}$ A) or less, preferably 10 zA/μm or less. The transistor 162 with excellent off-state current characteristics can be obtained with the use of such an i-type (intrinsic) oxide semiconductor.

Note that although the channel formation region of the transistor 162 includes an oxide semiconductor in this embodiment, an embodiment of the disclosed invention is not limited thereto. A material capable of realizing off-state current characteristics comparable to those of an oxide semiconductor material, for example, a widegap material (Eg>3 eV), such as silicon carbide, or the like may be employed.

The capacitor 164 in FIGS. 1A-1, 1A-2, and 1B includes at least the gate electrode 110a, the gate insulating layer 146, and an electrode 148b. In other words, the gate electrode 110a functions as one electrode of the capacitor 164, and the electrode 148b functions as the other electrode of the capacitor 164.

Note that a difference between FIG. 1A-1 and FIG. 1A-2 is whether or not the capacitor 164 includes the oxide semiconductor layer 144 as a component. In the case where the capacitor 164 includes the oxide semiconductor layer 144 as illustrated in FIG. 1A-1, malfunction of the capacitor 164 which may be caused by a reduction in thickness of the gate insulating layer 146 can be suppressed. In other words, the yield of the semiconductor device can be improved. On the other hand, in the case where the capacitor 164 does not include the oxide semiconductor layer 144 as illustrated in FIG. 1A-2, the capacitance may be increased as compared to the case where the capacitor 164 includes the oxide semiconductor layer 144.

Note that in the transistor 162 and the capacitor 164, each electrode preferably has a tapered end portion. The taper angle is 30° to 60°, for example. Note that the "taper angle" means an angle formed by the side surface and the bottom surface of a layer having a tapered shape (for example, the gate electrode 148a) when observed from a direction perpendicular to a cross section thereof (a plane perpendicular to the substrate surface). In this manner, when an electrode has a tapered end portion, coverage of the electrode with a layer thereover can be improved and disconnection of the layer can be prevented.

MODIFIED EXAMPLES

Figures 1, 2A:
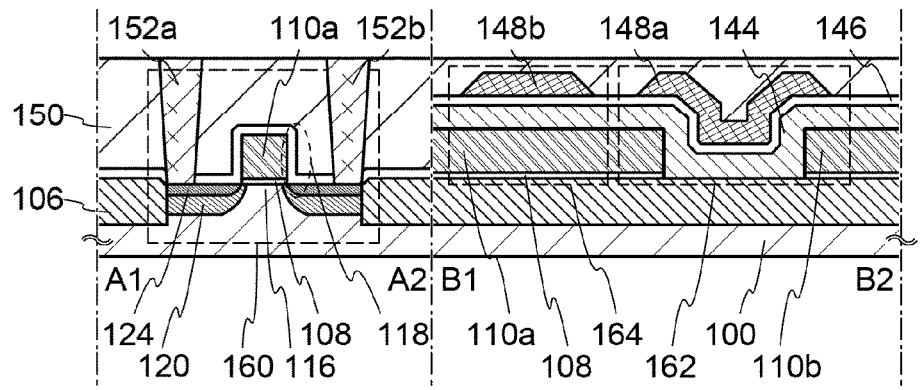
Figures 2, 2A:
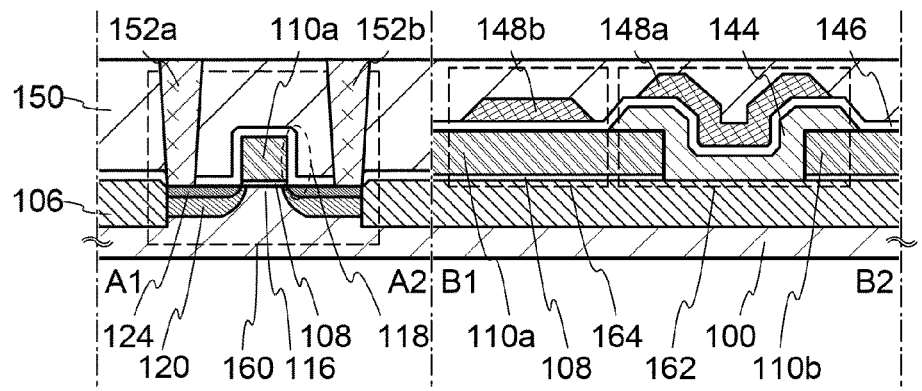
Figure 2B:
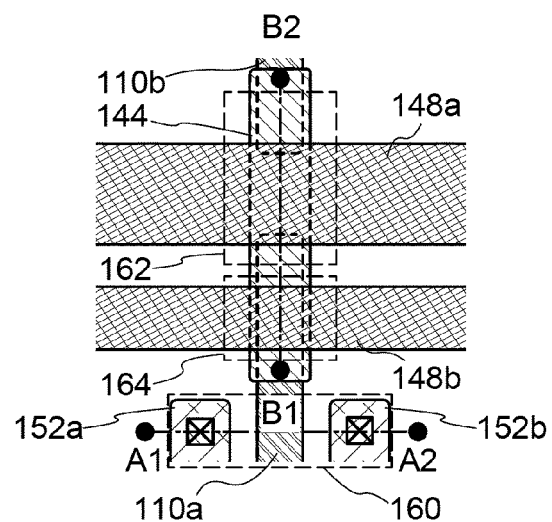
Figures 1, 3A:
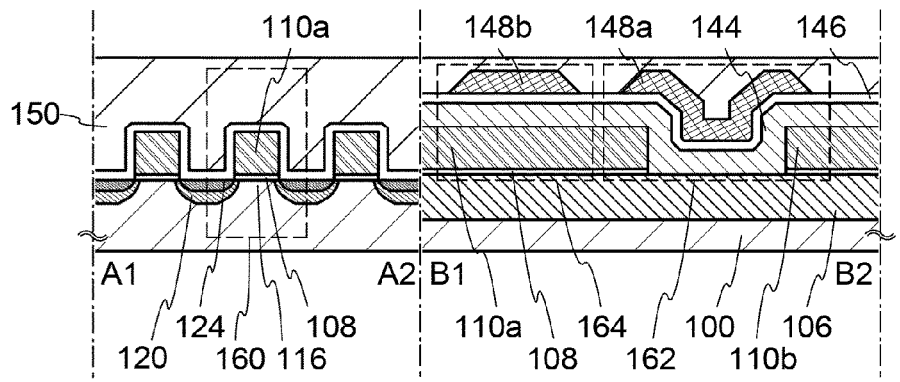
Figures 2, 3A:
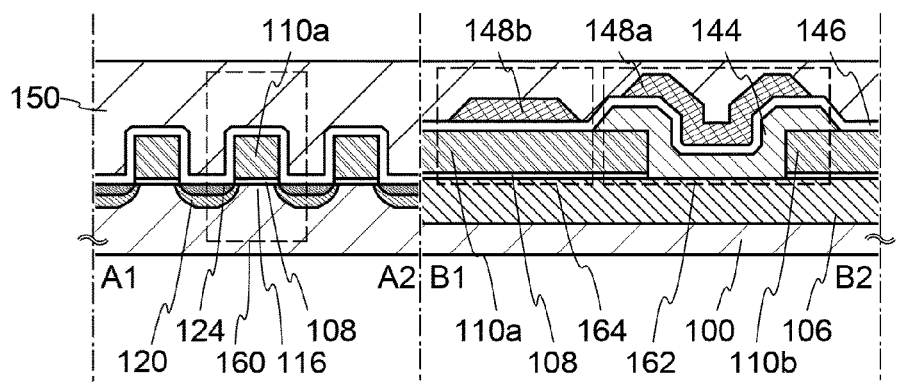
Figure 3B:
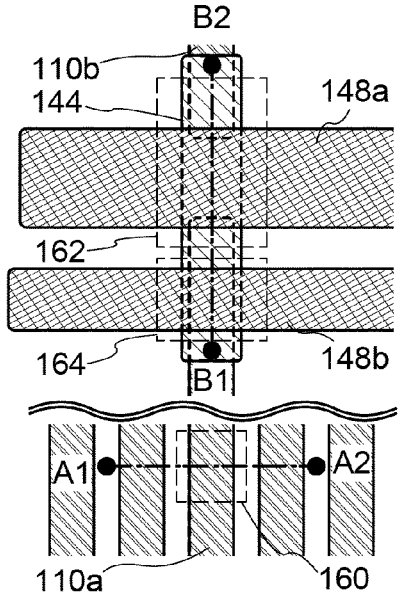

FIGS. 2A-1, 2A-2, and 2B and FIGS. 3A-1, 3A-2, and 3B illustrate modified examples of semiconductor devices. FIGS. 2A-1 and 2A-2 and FIGS. 3A-1 and 3A-2 are cross-sectional views of semiconductor devices, and FIG. 2B and FIG. 3B are plan views of the semiconductor devices. Here, FIG. 2A-1 corresponds to a cross section along line A1-A2 and line B1-B2 in FIG. 2B. A plan view corresponding to FIG. 2A-2 is omitted here because it is similar to FIG. 2B except for part of the structure. In addition, FIG. 3A-1 corresponds to a cross section along line A1-A2 and line B1-B2 in FIG. 3B. A plan view corresponding to FIG. 3A-2 is omitted here because it is similar to FIG. 3B except for part of the structure.

A difference between the semiconductor device illustrated in FIGS. 2A-1, 2A-2, and 2B and the semiconductor device illustrated in FIGS. 1A-1, 1A-2, and 1B is whether or not the sidewall insulating layer 118 is provided. That is, the semiconductor device in FIGS. 2A-1, 2A-2, and 2B does not include a sidewall insulating layer. In addition, since a sidewall insulating layer is not provided, the impurity regions 114 are not formed. Thus, in the case where a sidewall insulating layer is not provided, higher integration can be achieved more easily than in the case where a sidewall insulating layer is provided. In addition, the manufacturing process can be more simplified than in the case where a sidewall insulating layer is provided.

Note that a difference between FIG. 2A-1 and FIG. 2A-2 is whether or not the capacitor 164 includes the oxide semiconductor layer 144 as a component. An effect or the like is similar to that in the case of FIG. 1A-2.

A difference between the semiconductor device illustrated in FIGS. 3A-1, 3A-2, and 3B and the semiconductor device illustrated in FIGS. 1A-1, 1A-2, and 1B is whether or not the sidewall insulating layer 118 is provided. That is, the semiconductor device in FIGS. 3A-1, 3A-2, and 3B does not include a sidewall insulating layer. In addition, since a sidewall insulating layer is not provided, the impurity regions 114 are not formed.

Furthermore, a difference between the semiconductor device illustrated in FIGS. 3A-1, 3A-2, and 3B and the semiconductor device illustrated in FIGS. 2A-1, 2A-2, and 2B is whether or not the source or drain electrode 152a and the source or drain electrode 152b of the transistor 160 are provided. In other words, in the semiconductor device illustrated in FIGS. 3A-1, 3A-2, and 3B, a source region (or a source electrode) of the transistor 160 is combined with a drain region (or a drain electrode) of an adjacent transistor; thus, not every transistor is provided with a source electrode and a drain electrode. Note that the transistors 160 at both ends are provided with an electrode corresponding to the source or drain electrode 152a and the source or drain electrode 152b.

In the case where a sidewall insulating layer is not provided and some source electrodes and drain electrodes are omitted as described above, higher integration can be achieved more easily than in the case where these components are provided. In addition, the manufacturing process can be more simplified than in the case where these components are provided.

Note that a difference between FIG. 3A-1 and FIG. 3A-2 is whether or not the capacitor 164 includes the oxide semiconductor layer 144 as a component. An effect or the like is similar to that in the case of FIG. 1A-2.

<Manufacturing Method of Semiconductor Device>

Next, a manufacturing method of the semiconductor device corresponding to FIGS. 1A-1, 1A-2, and 1B will be described. First, a manufacturing method of a first transistor (the transistor 160) will be described below with reference to FIGS. 4A to 4G; then, a manufacturing method of a second transistor (the transistor 162) and a capacitor (the capacitor 164) will be described with reference to FIGS. 5A to 5D.

<Manufacturing Method of First Transistor>

First, a manufacturing method of the transistor 160 which is the first transistor will be described with reference to FIGS. 4A to 4G. Note that a manufacturing process of the transistor 160 is mainly illustrated in FIGS. 4A to 4G, where a cross section along line B1-B2 is omitted.

Figure 4A:
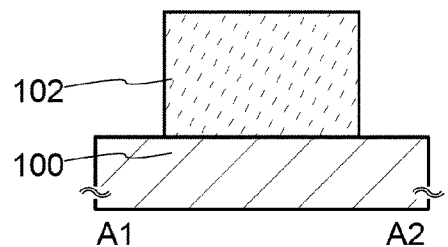
FIGS. 4A to 4G are cross-sectional views illustrating a manufacturing process of a semiconductor device.

First, the substrate 100 including a semiconductor material is prepared (see FIG. 4A). A single crystal semiconductor substrate or a polycrystalline semiconductor substrate of silicon, silicon carbide, or the like, a compound semiconductor substrate of silicon germanium or the like, an SOI substrate, or the like can be used as the substrate 100 including a semiconductor material. Here, an example of the case where a single crystal silicon substrate is used as the substrate 100 including a semiconductor material is described. Note that the term "SOI substrate" generally means a substrate where a silicon semiconductor layer is provided over an insulating surface. In this specification and the like, the term "SOI substrate" also means a substrate where a semiconductor layer including a material other than silicon is provided over an insulating surface. That is, a semiconductor layer included in the "SOI substrate" is not limited to a silicon semiconductor layer. Moreover, the SOI substrate can be a substrate having a structure where a semiconductor layer is provided over an insulating substrate such as a glass substrate with an insulating layer interposed therebetween.

A protective layer 102 serving as a mask for forming an element isolation insulating layer is formed over the substrate 100 (see FIG. 4A). As the protective layer 102, an insulating layer formed using a material such as silicon oxide, silicon nitride, silicon oxynitride, or the like can be used, for example. Note that before or after this step, an impurity element imparting n-type conductivity or an impurity element imparting p-type conductivity may be added to the substrate 100 in order to control the threshold voltage of the transistor. When the semiconductor material included in the substrate 100 is silicon, phosphorus, arsenic, or the like can be used as the impurity imparting n-type conductivity. Boron, aluminum, gallium, or the like can be used as the impurity imparting p-type conductivity.

Next, part of the substrate 100 in a region not covered with the protective layer 102 (i.e., in an exposed region) is removed by etching using the protective layer 102 as a mask. Thus, a semiconductor region 104 isolated from other semiconductor regions is formed (see FIG. 4B). As the etching, dry etching is preferably performed, but wet etching may be performed. An etching gas or an etchant can be selected as appropriate depending on a material to be etched.

Figure 4B:
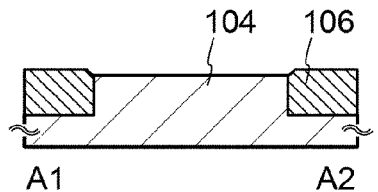

Then, an insulating layer is formed so as to cover the semiconductor region 104, and the insulating layer in a region overlapping with the semiconductor region 104 is selectively removed; thus, the element isolation insulating layer 106 is formed (see FIG. 4B). The insulating layer is formed using silicon oxide, silicon nitride, silicon oxynitride, or the like. As a method for removing the insulating layer, any of etching treatment, polishing treatment such as CMP, and the like can be employed. Note that the protective layer 102 is removed after the formation of the semiconductor region 104 or after the formation of the element isolation insulating layer 106.

Next, an insulating layer is formed over the semiconductor region 104, and a layer including a conductive material is formed over the insulating layer.

The insulating layer is processed into a gate insulating layer later and may have a single-layer structure or a stacked-layer structure with a film including silicon oxide, silicon oxynitride, silicon nitride, hafnium oxide, aluminum oxide, tantalum oxide, yttrium oxide, hafnium silicate (HfSi$_x$O$_y$ (x>0, y>0)), hafnium silicate (HfSi$_x$O$_y$ (x>0, y>0)) to which nitrogen is added, hafnium aluminate (HfAl$_x$O$_y$ (x>0, y>0)) to which nitrogen is added, or the like which can be formed by a CVD method, a sputtering method, or the like. Alternatively, the insulating layer may be formed in such a manner that a surface of the semiconductor region 104 is oxidized or nitrided by high-density plasma treatment or thermal oxidation treatment. The high-density plasma treatment can be performed using, for example, a mixed gas of any of a rare gas such as He, Ar, Kr, or Xe, oxygen, nitrogen oxide, ammonia, nitrogen, hydrogen, and the like. The insulating layer can have a thickness of 1 nm to 100 nm, preferably, 10 nm to 50 nm, for example.

The layer including a conductive material can be formed using a metal material such as aluminum, copper, titanium, tantalum, or tungsten. The layer including a conductive material may be formed using a semiconductor material such as polycrystalline silicon. There is no particular limitation on the method for forming the layer including a conductive material, and a variety of film formation methods such as an evaporation method, a CVD method, a sputtering method, or a spin coating method can be employed. Note that this embodiment shows an example of the case where the layer including a conductive material is formed using a metal material.

Figure 4C:
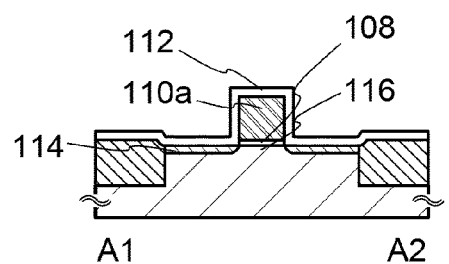

After that, the insulating layer and the layer including a conductive material are selectively etched; thus, the gate insulating layer 108 and the gate electrode 110a are formed (see FIG. 4C). Note that the source or drain electrode 110b of the transistor 162 is also formed at this time.

Next, an insulating layer 112 that covers the gate electrode 110a is formed (see FIG. 4C). Phosphorus (P), arsenic (As), or the like is then added to the semiconductor region 104, whereby the impurity regions 114 with a shallow junction depth are formed (see FIG. 4C). Note that phosphorus or arsenic is added here in order to form an n-type transistor; an impurity element such as boron (B) or aluminum (Al) may be added in the case of forming a p-type transistor. By the formation of the impurity regions 114, the channel formation region 116 is formed in the semiconductor region 104 below the gate insulating layer 108 (see FIG. 4C). Here, the concentration of the impurity added can be set as appropriate; the concentration is preferably set high when a semiconductor element is highly miniaturized. The step in which the impurity regions 114 are formed after the formation of the insulating layer 112 is employed here; alternatively, the insulating layer 112 may be formed after the formation of the impurity regions 114.

Figure 4D:
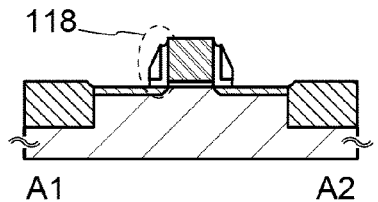
Figure 4E:
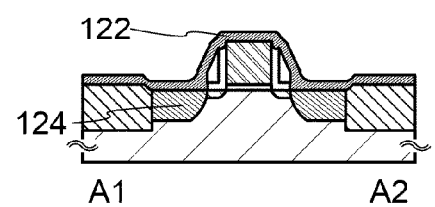
Figure 4F:
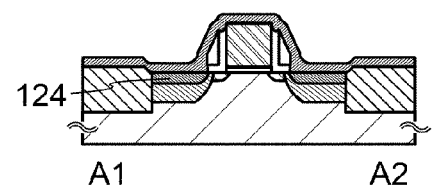

Next, the sidewall insulating layer 118 is formed (see FIG. 4D). An insulating layer is formed so as to cover the insulating layer 112 and then subjected to highly anisotropic etching, whereby the sidewall insulating layer 118 can be formed in a self-aligned manner. At this time, it is preferable to partly etch the insulating layer 112 so that a top surface of the gate electrode 110a and top surfaces of the impurity regions 114 are exposed. Note that in some cases, the sidewall insulating layer 118 is not formed, in order to achieve higher integration or the like.

Next, an insulating layer is formed so as to cover the gate electrode 110a, the impurity regions 114, the sidewall insulating layer 118, and the like. Phosphorus (P), arsenic (As), or the like is then added to regions which are in contact with the impurity regions 114, whereby the high-concentration impurity regions 120 are formed (see FIG. 4E). After that, the insulating layer is removed, and a metal layer 122 is formed so as to cover the gate electrode 110a, the sidewall insulating layer 118, the high-concentration impurity regions 120, and the like (see FIG. 4E). The metal layer 122 can be formed by a variety of film formation methods such as a vacuum evaporation method, a sputtering method, and a spin coating method. The metal layer 122 is preferably formed using a metal material which forms a low-resistance metal compound by reacting with a semiconductor material included in the semiconductor region 104. Examples of such metal materials are titanium, tantalum, tungsten, nickel, cobalt, platinum, and the like.

Next, heat treatment is performed so that the metal layer 122 reacts with the semiconductor material. Thus, the metal compound regions 124 that are in contact with the high-concentration impurity regions 120 are formed (see FIG. 4F). Note that when the gate electrode 110a is formed using polycrystalline silicon or the like, a metal compound region is also formed in a portion of the gate electrode 110a which is in contact with the metal layer 122.

As the heat treatment, irradiation with a flash lamp can be employed, for example. Although it is needless to say that another heat treatment method may be used, a method by which heat treatment can be achieved in an extremely short time is preferably used in order to improve the controllability of chemical reaction for formation of the metal compound. Note that the metal compound regions are formed by reaction of the metal material and the semiconductor material and have sufficiently high conductivity. The formation of the metal compound regions can properly reduce electric resistance and improve element characteristics. Note that the metal layer 122 is removed after the metal compound regions 124 are formed.

Figure 4G:
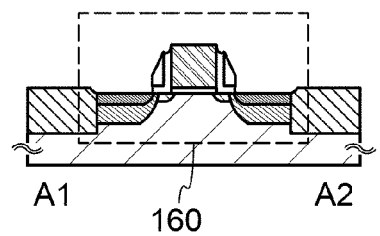

Through the above steps, the transistor 160 is formed with the use of the substrate 100 including a semiconductor material (see FIG. 4G). Although electrodes corresponding to a source electrode and a drain electrode are not formed at the stage illustrated in FIG. 4G, a structure in this state is referred to as the transistor 160 for convenience.

<Manufacturing Method of Second Transistor and Capacitor>

Next, a manufacturing method of the transistor 162 and the capacitor 164 will be described with reference to FIGS. 5A to 5D.

Figure 5A:
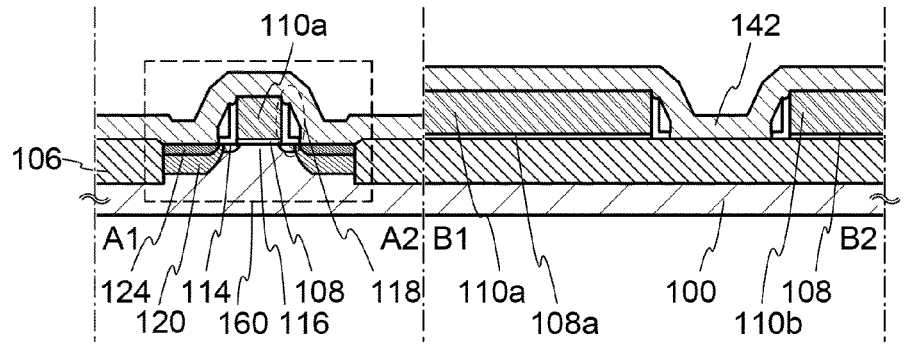
FIGS. 5A to 5D are cross-sectional views illustrating a manufacturing process of a semiconductor device.
Figure 5B:
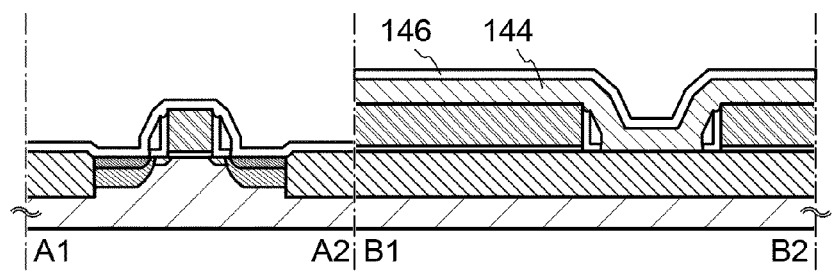

First, an oxide semiconductor layer 142 is formed so as to be in contact with the gate electrode 110a, which is also part of the transistor 162, and the source or drain electrode 110b (see FIG. 5A).

The oxide semiconductor layer 142 can be formed using any of the following oxide semiconductors: a four-component metal oxide such as In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, and an In—Mg—O-based oxide semiconductor; an In—O-based oxide semiconductor; a Sn—O-based oxide semiconductor; and a Zn—O-based oxide semiconductor.

In particular, an In—Ga—Zn—O-based oxide semiconductor material has sufficiently high resistance when there is no electric field and thus off-state current can be sufficiently reduced. In addition, also having high field-effect mobility, the In—Ga—Zn—O-based oxide semiconductor material is suitable for a semiconductor material used in a semiconductor device.

As a typical example of the In—Ga—Zn—O-based oxide semiconductor material, an oxide semiconductor material represented by $InGaO_3(ZnO)_m$ (m>0) is given. Using M instead of Ga, there is an oxide semiconductor material represented by $InMO_3(ZnO)_m$ (m>0). Here, M denotes one or more metal elements selected from gallium (Ga), aluminum (Al), iron (Fe), nickel (Ni), manganese (Mn), cobalt (Co), and the like. For example, M may be Ga, Ga and Al, Ga and Fe, Ga and Ni, Ga and Mn, Ga and Co, or the like. Note that the above-described compositions are derived from the crystal structures that the oxide semiconductor material can have and are mere examples.

As the target used for forming the oxide semiconductor layer 142 by a sputtering method, a target having a composition ratio of In:Ga:Zn=1:x:y (x is greater than or equal to 0 and y is greater than or equal to 0.5 and less than or equal to 5) is preferably used. For example, a target having a composition ratio of In:Ga:Zn=1:1:1 [atomic ratio] (x=1, y=1) (i.e., $In_2O_3$:$Ga_2O_3$:ZnO=1:1:2 [molar ratio]) or the like can be used. In addition, a target having a composition ratio of In:Ga:Zn=1:1:0.5 [atomic ratio] (x=1, y=0.5), a target having a composition ratio of In:Ga:Zn=1:1:2 [atomic ratio] (x=1, y=2), or a target having a composition ratio of In:Ga:Zn=1:0:1 [atomic ratio] (x=0, y=1) can also be used.

In this embodiment, the oxide semiconductor layer 142 having an amorphous structure is formed by a sputtering method with the use of an In—Ga—Zn—O-based metal oxide target.

The relative density of the metal oxide in the metal oxide target is greater than or equal to 80%, preferably greater than or equal to 95%, and more preferably greater than or equal to 99.9%. The use of the metal oxide target with high relative density makes it possible to form the oxide semiconductor layer 142 having a dense structure.

The atmosphere in which the oxide semiconductor layer 142 is formed is preferably a rare gas (typically, argon) atmosphere, an oxygen atmosphere, or a mixed atmosphere of a rare gas (typically, argon) and oxygen. Specifically, it is preferable to use a high-purity gas atmosphere, for example, from which an impurity such as hydrogen, water, a hydroxyl group, or hydride is removed to a concentration of 1 ppm or less (preferably, 10 ppb or less).

In forming the oxide semiconductor layer 142, for example, an object to be processed is held in a treatment chamber that is maintained under reduced pressure, and the object to be processed is heated to a temperature higher than or equal to 100° C. and lower than 550° C., preferably higher than or equal to 200° C. and lower than or equal to 400° C. Alternatively, the temperature of an object to be processed in forming the oxide semiconductor layer 142 may be room temperature. Then, moisture in the treatment chamber is removed, a sputtering gas from which hydrogen, water, or the like are removed is introduced, and the above-described target is used; thus, the oxide semiconductor layer 142 is formed. By forming the oxide semiconductor layer 142 while heating the object to be processed, an impurity in the oxide semiconductor layer 142 can be reduced. Moreover, damage due to sputtering can be reduced. In order to remove the moisture in the treatment chamber, it is preferable to use an entrapment vacuum pump. For example, a cryopump, an ion pump, a titanium sublimation pump, or the like can be used. A turbo pump provided with a cold trap may be used. Since hydrogen, water, or the like can be removed from the treatment chamber evacuated with a cryopump or the like, the concentration of an impurity in the oxide semiconductor layer 142 can be reduced.

For example, conditions for forming the oxide semiconductor layer 142 can be set as follows: the distance between the object to be processed and the target is 170 mm, the pressure is 0.4 Pa, the direct current (DC) power is 0.5 kW, and the atmosphere is an oxygen (100% oxygen) atmosphere, an argon (100% argon) atmosphere, or a mixed atmosphere of oxygen and argon. Note that a pulsed direct current (DC) power source is preferably used because dust (powder or flake-like substances formed at the time of the film formation) can be reduced and the film thickness can be uniform. The thickness of the oxide semiconductor layer 142 is set in the range of 1 nm to 50 nm, preferably 1 nm to 30 nm, more preferably 1 nm to 10 nm. The use of the oxide semiconductor layer 142 of such a thickness makes it possible to suppress a short channel effect which is caused by miniaturization. Note that the appropriate thickness of the oxide semiconductor layer 142 differs depending on the oxide semiconductor material to be used, the intended use of the semiconductor device, or the like; therefore, the thickness can be determined as appropriate in accordance with the material, the intended use, or the like.

Note that before the oxide semiconductor layer 142 is formed by a sputtering method, reverse sputtering in which plasma is generated with an argon gas introduced is preferably performed so that a material attached to a formation surface (e.g., a surface of the element isolation insulating layer 106) is removed. Here, the reverse sputtering is a method in which ions collide with a surface to be processed so that the surface is modified, in contrast to normal sputtering in which ions collide with a sputtering target. An example of a method for making ions collide with a surface to be processed is a method in which high-frequency voltage is applied to the surface side in an argon atmosphere so that plasma is generated near the object to be processed. Note that an atmosphere of nitrogen, helium, oxygen, or the like may be used instead of an argon atmosphere.

Next, a mask is formed over the oxide semiconductor layer 142, and the oxide semiconductor layer 142 is processed by etching with the use of the mask; thus, the oxide semiconductor layer 144 is formed. After that, the gate insulating layer 146 is formed in contact with the oxide semiconductor layer 144 (see FIG. 5B). Although the case where the oxide semiconductor layer 142 is processed is described here, there is a case where the oxide semiconductor layer 142 is used without being patterned.

As a method for etching the oxide semiconductor layer 142, either dry etching or wet etching may be employed. It is needless to say that dry etching and wet etching can be used in combination. The etching conditions (e.g., an etching gas or an etchant, etching time, and temperature) are set as appropriate depending on the material so that the oxide semiconductor layer can be etched into a desired shape.

An example of an etching gas which can be used for dry etching is a gas containing chlorine (a chlorine-based gas such as chlorine ($Cl_2$), boron trichloride ($BCl_3$), silicon tetrachloride ($SiCl_4$), or carbon tetrachloride ($CCl_4$)). Moreover, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like may be used.

As dry etching, a parallel plate reactive ion etching (RIE) method, an inductively coupled plasma (ICP) etching method, or the like can be used. In order to etch the layer into a desired shape, etching conditions (e.g., the amount of electric power applied to a coiled electrode, the amount of electric power applied to an electrode on the substrate side, and the electrode temperature on the substrate side) are set as appropriate.

As an etchant which can be used for wet etching, a mixed solution of phosphoric acid, acetic acid, and nitric acid, an ammonia hydrogen peroxide mixture (hydrogen peroxide solution of 31 wt %:ammonia solution of 28 wt %:water=5:2:2), or the like can be used. An etchant such as ITO-07N (produced by KANTO CHEMICAL CO., INC.) may also be used.

Note that the oxide semiconductor layer 144 is preferably formed by etching so as to have a tapered end portion. Here, the taper angle is preferably 30° to 60°, for example. Note that the "taper angle" means an angle formed by the side surface and the bottom surface of a layer having a tapered shape (for example, the oxide semiconductor layer 144) when observed from a direction perpendicular to a cross section thereof (a plane perpendicular to the substrate surface). When the oxide semiconductor layer 144 is formed by etching so as to have a tapered end portion, coverage of the oxide semiconductor layer 144 with the gate insulating layer or the like can be improved and disconnection of the gate insulating layer or the like can be prevented.

After that, heat treatment (first heat treatment) is preferably performed on the oxide semiconductor layer 144. Through the first heat treatment, excess hydrogen (including water or a hydroxyl group) in the oxide semiconductor layer 144 can be removed, the structure of the oxide semiconductor layer can be ordered, and defect states in an energy gap can be reduced. For example, the temperature of the first heat treatment can be set higher than or equal to 300° C. and lower than 550° C., or higher than or equal to 400° C. and lower than or equal to 500° C.

For example, after an object to be processed is introduced into an electric furnace including a resistance heater or the like, the heat treatment can be performed at 450° C. for one hour in a nitrogen atmosphere. The oxide semiconductor layer 144 is not exposed to the air during the heat treatment so that entry of water or hydrogen can be prevented.

The heat treatment apparatus is not limited to the electric furnace and may be an apparatus for heating an object to be processed by thermal radiation or thermal conduction from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas that does not react with an object to be processed by heat treatment, for example, nitrogen or a rare gas such as argon is used.

For example, as the first heat treatment, GRTA treatment may be performed as follows. The object to be processed is put in a heated inert gas atmosphere, heated for several minutes, and taken out of the inert gas atmosphere. The GRTA treatment enables high-temperature heat treatment in a short time. Moreover, the GRTA treatment can be employed even when the temperature exceeds the upper temperature limit of the object to be processed. Note that the inert gas may be switched to a gas including oxygen during the treatment. This is because defect states in an energy gap caused by oxygen deficiency can be reduced by performing the first heat treatment in an atmosphere including oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is set to 6N (99.9999%) or more, preferably 7N (99.99999%) or more (i.e., the impurity concentration is 1 ppm or less, preferably 0.1 ppm or less).

In any case, a transistor with extremely excellent characteristics can be obtained with the use of the oxide semiconductor layer 144 which is an i-type (intrinsic) or substantially i-type oxide semiconductor layer obtained by reducing an impurity through the first heat treatment.

The above heat treatment (the first heat treatment) can also be referred to as dehydration treatment, dehydrogenation treatment, or the like because it has the effect of removing hydrogen, water, or the like. The dehydration treatment or the dehydrogenation treatment can be performed after the oxide semiconductor layer is formed, after the gate insulating layer is formed, or after a gate electrode layer is formed. Such dehydration treatment or dehydrogenation treatment may be performed once or plural times.

The gate insulating layer 146 can be formed by a CVD method, a sputtering method, or the like. The gate insulating layer 146 is preferably formed so as to contain silicon oxide, silicon nitride, silicon oxynitride, aluminum oxide, tantalum oxide, hafnium oxide, yttrium oxide, hafnium silicate (Hf-$Si_xO_y$, (x>0, y>0)), hafnium silicate (HfSi$_x$O$_y$, (x>0, y>0)) to which nitrogen is added, hafnium aluminate (HfAl$_x$O$_y$, (x>0, y>0)) to which nitrogen is added, or the like. The gate insulating layer 146 may have a single-layer structure or a stacked-layer structure. There is no particular limitation on the thickness of the gate insulating layer 146; the thickness is preferably small in order to ensure the operation of the transistor when the semiconductor device is miniaturized. For example, in the case of using silicon oxide, the thickness can be 1 nm to 100 nm, preferably 10 nm to 50 nm.

When the gate insulating layer is thin as described above, gate leakage due to a tunnel effect or the like becomes a problem. In order to solve the problem of gate leakage, the gate insulating layer 146 may be formed using a high dielectric constant (high-k) material such as hafnium oxide, tantalum oxide, yttrium oxide, hafnium silicate (HfSi$_x$O$_y$, (x>0, y>0)), hafnium silicate (HfSi$_x$O$_y$, (x>0, y>0)) to which nitrogen is added, or hafnium aluminate (HfAl$_x$O$_y$, (x>0, y>0)) to which nitrogen is added. The use of a high-k material for the gate insulating layer 146 makes it possible to increase the thickness in order to suppress gate leakage as well as ensuring electrical properties. Note that a stacked-layer structure of a film including a high-k material and a film including any of silicon oxide, silicon nitride, silicon oxynitride, silicon nitride oxide, aluminum oxide, and the like may also be employed.

After the gate insulating layer 146 is formed, second heat treatment is preferably performed in an inert gas atmosphere or an oxygen atmosphere. The temperature of the heat treatment is set in the range of 200° C. to 450° C., preferably 250° C. to 350° C. For example, the heat treatment may be performed at 250° C. for 1 hour in a nitrogen atmosphere. By the second heat treatment, variation in electrical characteristics of the transistor can be reduced. In the case where the gate insulating layer 146 contains oxygen, oxygen can be supplied to the oxide semiconductor layer 144 and oxygen vacancies in the oxide semiconductor layer 144 can be filled; thus, an i-type (intrinsic) or substantially i-type oxide semiconductor layer can also be formed.

Note that the second heat treatment is performed in this embodiment after the gate insulating layer 146 is formed; there is no particular limitation on the timing of the second heat treatment. For example, the second heat treatment may be performed after the gate electrode is formed. Alternatively, the first heat treatment and the second heat treatment may be performed in succession, or the first heat treatment may double as the second heat treatment, or the second heat treatment may double as the first heat treatment.

Figure 5C:
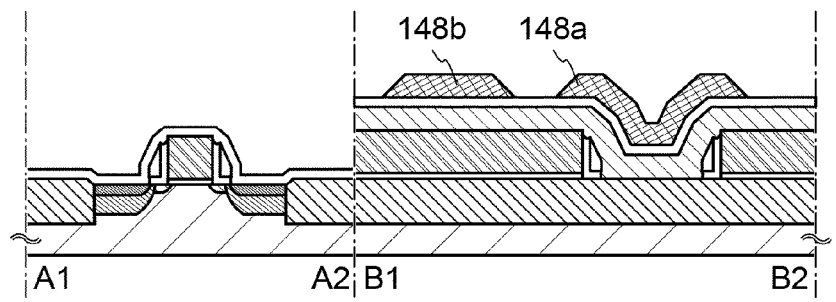

Next, over the gate insulating layer 146, the gate electrode 148a is formed in a region overlapping the oxide semiconductor layer 144, and the electrode 148b (capacitor electrode) is formed in a region overlapping the gate electrode 110a (see FIG. 5C). The gate electrode 148a and the electrode 148b can be formed by forming a conductive layer so as to cover the gate insulating layer 146 and then selectively etching the conductive layer.

The conductive layer to be the gate electrode 148a, the electrode 148b, and the like can be formed by a PVD method such as a sputtering method, or a CVD method such as a plasma CVD method. As a material of the conductive layer, an element selected from aluminum, chromium, copper, tantalum, titanium, molybdenum, and tungsten, an alloy including any of these elements as a component, or the like can be used. A material including one of manganese, magnesium, zirconium, and beryllium or a combination of a plurality of these elements may be used. A material including aluminum and an element selected from titanium, tantalum, tungsten, molybdenum, chromium, neodymium, and scandium or a combination of a plurality of these elements may alternatively be used.

The conductive layer may have a single-layer structure or a stacked-layer structure including two or more layers. For example, the conductive layer may have a single-layer structure of a titanium film or a titanium nitride film, a single-layer structure of an aluminum film including silicon, a two-layer structure in which a titanium film is stacked over an aluminum film, a two-layer structure in which a titanium film is stacked over a titanium nitride film, a three-layer structure in which a titanium film, an aluminum film, and a titanium film are stacked in this order, or the like. Note that the conductive layer having a single-layer structure of a titanium film or a titanium nitride film has an advantage in that it can be easily processed into an electrode having a tapered shape.

The conductive layer may be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials including silicon or silicon oxide can be used.

The conductive layer is preferably etched such that a variety of electrodes are formed to have a tapered end portion. The taper angle is 30° to 60°, for example. Even in the case where another conductive layer, an insulating layer, a semiconductor layer, or the like is formed later, when etching is performed such that an electrode has a tapered end portion, coverage of the electrode with the layer can be improved and disconnection of the layer can be prevented.

After that, the interlayer insulating layer 150 is formed so as to cover the gate electrode 148a and the like. Openings are formed in the interlayer insulating layer 150 and the gate insulating layer 146 so as to reach the metal compound regions 124. Then, the source or drain electrode 152a and the source or drain electrode 152b connected to the metal compound regions 124 are formed (see FIG. 5D).

The interlayer insulating layer 150 can be formed by a CVD method, a sputtering method, or the like. There is no particular limitation on the material of the interlayer insulating layer 150; the interlayer insulating layer 150 is preferably formed using a material such as silicon oxide, silicon nitride, silicon oxynitride, or aluminum oxide. The interlayer insulating layer 150 may have a single-layer structure or a stacked-layer structure. Note that the interlayer insulating layer 150 is desirably formed so as to have a flat surface. This is because an electrode, a wiring, or the like having a multi-layer structure which is necessary in the case of miniaturizing the semiconductor device or the like can be favorably formed over the interlayer insulating layer 150 when the interlayer insulating layer 150 has a flat surface. Note that the interlayer insulating layer 150 can be planarized using a method such as chemical mechanical polishing (CMP).

As a method for etching the interlayer insulating layer 150, either dry etching or wet etching may be employed. It is needless to say that dry etching and wet etching can be used in combination. The etching conditions (e.g., an etching gas or an etchant, etching time, and temperature) are set as appropriate depending on the material so that the interlayer insulating layer can be etched into a desired shape.

The source or drain electrode 152a and the source or drain electrode 152b can be formed in such a manner, for example, that a conductive layer is formed in a region including the openings by a PVD method, a CVD method, or the like and then part of the conductive layer is removed by etching, CMP, or the like. Specifically, it is possible to employ a method, for example, in which a thin titanium film is formed in a region including the openings by a PVD method and a thin titanium nitride film is formed by a CVD method, and then, a tungsten film is formed so as to be embedded in the openings. Here, the titanium film formed by a PVD method functions to reduce an oxide film (e.g., a natural oxide film) formed on a surface where the titanium film is formed, and to decrease the contact resistance with a lower electrode (here, the metal compound regions 124) or the like. The titanium nitride film formed after the formation of the titanium film has a barrier function for suppressing diffusion of the conductive material. A copper film may be formed by a plating method after the formation of a barrier film of titanium, titanium nitride, or the like.

Note that a wiring or the like may be additionally formed after the source or drain electrode 152a or the like is formed.

Figure 5D:
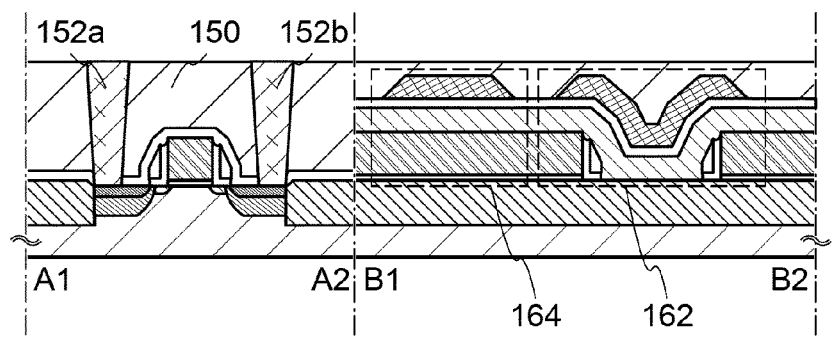

Through the above steps, the transistor 162 including the oxide semiconductor layer 144, which is purified, for a channel formation region is completed (see FIG. 5D). In addition, the capacitor 164 is completed.

The transistor 162 illustrated in FIG. 5D includes the oxide semiconductor layer 144, the gate electrode 110a (for the transistor 162, the source or drain electrode) electrically connected to the oxide semiconductor layer 144 including a channel formation region, the source or drain electrode 110b, the gate insulating layer 146 covering these components, and the gate electrode 148a over the gate insulating layer 146. The capacitor 164 includes the gate electrode 110a (for the transistor 162, the source or drain electrode), the oxide semiconductor layer 144, the gate insulating layer 146, and the electrode 148b over the gate insulating layer 146.

In the transistor 162 described in this embodiment, the oxide semiconductor layer 144 is purified and thus contains hydrogen at a concentration of $5 \times 10^{19}$ atoms/cm$^3$ or less, preferably $5 \times 10^{18}$ atoms/cm$^3$ or less, more preferably $5 \times 10^{17}$ atoms/cm$^3$ or less. In addition, the carrier density of the oxide semiconductor layer 144 is, for example, less than $1 \times 10^{12}$/cm$^3$, preferably less than $1.45 \times 10^{10}$/cm$^3$, which is sufficiently lower than the carrier density of a general silicon wafer (approximately $1 \times 10^{14}$/cm$^3$). Accordingly, the off-state current is sufficiently low. For example, the off-state current (per unit channel width (1 μm), here) of the transistor 162 at room temperature is 100 zA/μm (1 zA (zeptoampere) is $1 \times 10^{-21}$ A) or less, preferably 10 zA/μm or less.

In this manner, by using the oxide semiconductor layer 144 which is purified and is intrinsic, the off-state current of the transistor can be sufficiently reduced. In addition, by using such a transistor, a semiconductor device having novel characteristics (e.g., long-term memory-holding characteristics) can be obtained.

In addition, with a structure in which a gate electrode of a transistor including a material other than an oxide semiconductor is combined with a source or drain electrode of a transistor including an oxide semiconductor, higher integration can be easily achieved even in a situation where the connection relationship is complex.

The structures, methods, and the like described in this embodiment can be combined as appropriate with any of the structures, methods, and the like described in other embodiments.

Embodiment 2

In this embodiment, a specific structure example and operation of the semiconductor device according to the above embodiment will be described. Note that in some circuit diagrams mentioned below, "OS" is written beside a transistor in order to indicate that the transistor includes an oxide semiconductor.

Figures 1, 6A:
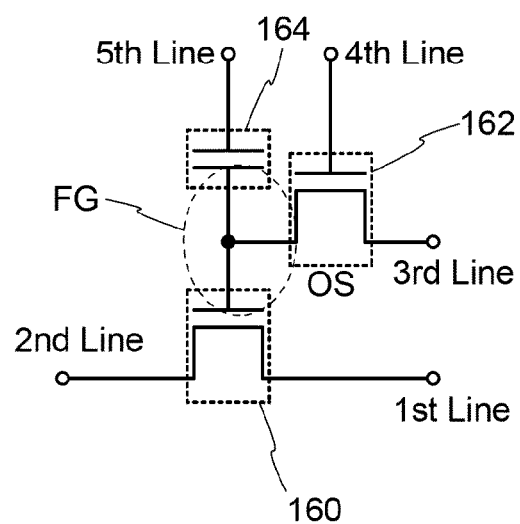
Figures 2, 6A:
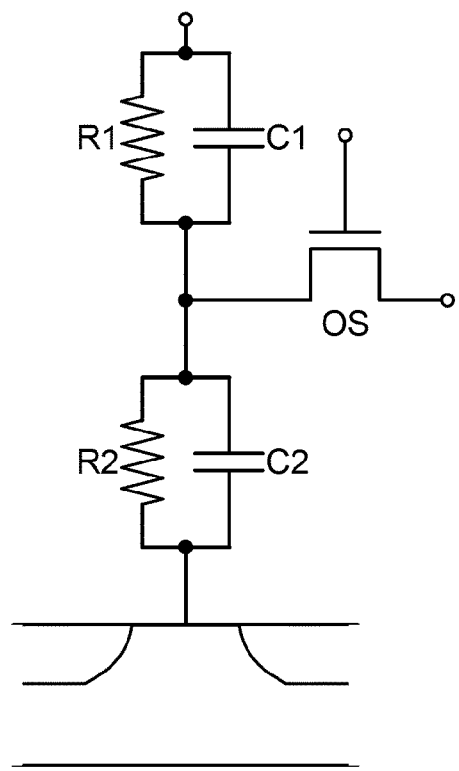

In a semiconductor device illustrated in FIG. 6A-1, a first wiring (1st Line, also referred to as a source line) is electrically connected to the source electrode of the transistor 160. A second wiring (2nd Line, also referred to as a bit line) is electrically connected to the drain electrode of the transistor 160. A third wiring (3rd Line, also referred to as a first signal line) is electrically connected to the other of the source electrode and the drain electrode of the transistor 162. A fourth wiring (4th Line, also referred to as a second signal line) is electrically connected to the gate electrode of the transistor 162. Furthermore, the gate electrode of the transistor 160 and one of the source electrode and the drain electrode of the transistor 162 are electrically connected to one electrode of the capacitor 164. A fifth wiring (5th Line, also referred to as a word line) is electrically connected to the other electrode of the capacitor 164.

Here, a transistor including an oxide semiconductor is used as the transistor 162. A transistor including an oxide semiconductor has a characteristic of a significantly small off-state current. For that reason, a potential of the gate electrode of the transistor 160 can be held for an extremely long time by turning off the transistor 162. By providing the capacitor 164, holding of charge applied to the gate electrode of the transistor 160 and reading of data held can be performed more easily.

The semiconductor device in FIG. 6A-1 utilizes a characteristic in which the potential of the gate electrode of the transistor 160 can be held, and can thus write, hold, and read data as follows.

First of all, writing and holding of data will be described. First, the potential of the fourth wiring is set to a potential at which the transistor 162 is turned on, so that the transistor 162 is turned on. Accordingly, the potential of the third wiring is supplied to the gate electrode of the transistor 160 and to the capacitor 164. That is, predetermined charge is applied to the gate electrode of the transistor 160 (writing). Here, one of two charges providing different potential levels (hereinafter referred to as a low-level charge and a high-level charge) is applied. After that, the potential of the fourth wiring is set to a potential at which the transistor 162 is turned off, so that the transistor 162 is turned off. Thus, the charge applied to the gate electrode of the transistor 160 is held (holding).

Since the off-state current of the transistor 162 is significantly small, the charge of the gate electrode of the transistor 160 is held for a long time.

Next, reading of data will be described. By supplying an appropriate potential (reading potential) to the fifth wiring while a predetermined potential (constant potential) is supplied to the first wiring, the potential of the second wiring varies depending on the amount of charge held at the gate electrode of the transistor 160. This is generally because, when the transistor 160 is an n-channel transistor, an apparent threshold voltage $V_{th\_H}$ in the case where a high-level charge is applied to the gate electrode of the transistor 160 is lower than an apparent threshold voltage $V_{th\_L}$ in the case where a low-level charge is applied to the gate electrode of the transistor 160. Here, an apparent threshold voltage refers to the potential of the fifth wiring, which is needed to turn on the transistor 160. Thus, the potential of the fifth wiring is set to a potential $V_0$ intermediate between $V_{th\_H}$ and $V_{th\_L}$, whereby charge applied to the gate electrode of the transistor 160 can be determined. For example, in the case where a high-level charge is applied in writing, when the potential of the fifth wiring is $V_0$ ($>V_{th\_H}$), the transistor 160 is turned on. In the case where a low-level charge is applied in writing, even when the potential of the fifth wiring is $V_0$ ($<V_{th\_L}$), the transistor 160 remains off. Therefore, the data held can be read by measuring the potential of the second wiring.

Note that in the case where data is not read out, a potential at which the transistor 160 is turned off regardless of the state of the gate electrode, that is, a potential lower than $V_{th\_H}$ may be supplied to the fifth wiring. Alternatively, a potential at which the transistor 160 is turned on regardless of the state of the gate electrode, that is, a potential higher than $V_{th\_L}$ may be supplied to the fifth wiring.

Next, rewriting of data will be described. Rewriting of data is performed in a manner similar to that of the writing and holding of data. That is, the potential of the fourth wiring is set to a potential at which the transistor 162 is turned on, so that the transistor 162 is turned on. Accordingly, the potential of the third wiring (potential for new data) is supplied to the gate electrode of the transistor 160 and to the capacitor 164. After that, the potential of the fourth wiring is set to a potential at which the transistor 162 is turned off, so that the transistor 162 is turned off. Accordingly, charge for new data is applied to the gate electrode of the transistor 160.

In the semiconductor device according to the disclosed invention, data can be directly rewritten by another writing of data as described above. Therefore, extraction of charge from a floating gate with the use of a high voltage which is necessary for a flash memory or the like is not needed, and thus a decrease in operation speed due to erasing operation can be suppressed. In other words, high-speed operation of the semiconductor device can be realized.

Note that the source electrode or the drain electrode of the transistor 162 is electrically connected to the gate electrode of the transistor 160 and therefore has a function similar to that of a floating gate of a floating gate transistor used for a nonvolatile memory element. Therefore, in drawings, a portion where the source electrode or the drain electrode of the transistor 162 is electrically connected to the gate electrode of the transistor 160 is called a floating gate portion FG in some cases. When the transistor 162 is turned off, the floating gate portion FG can be regarded as being embedded in an insulator and thus charge is held in the floating gate portion FG. The off-state current of the transistor 162 including an oxide semiconductor is smaller than or equal to 1/100000 of the off-state current of a transistor including a silicon semiconductor or the like; thus, loss of the charge accumulated in the floating gate portion FG due to leakage of the transistor 162 is negligible. That is, with the transistor 162 including an oxide semiconductor, a nonvolatile memory device which can hold data without being supplied with power can be realized.

For example, when the off-state current of the transistor 162 at room temperature is 10 zA (1 zA (zeptoampere) is $1\times10^{-21}$ A) or less and the capacitance of the capacitor 164 is approximately 10 fF, data can be held for $10^4$ seconds or longer. It is needless to say that the holding time depends on transistor characteristics and capacitance.

Further, in that case, the problem of deterioration of a gate insulating film (tunnel insulating film), which has been a problem of a conventional floating gate transistor, does not exist. That is, the problem of deterioration of a gate insulating film due to injection of an electron into a floating gate, which is a conventional problem, can be solved. This means that there is no limit on the number of times of writing in principle. Furthermore, a high voltage needed for writing or erasing in a conventional floating gate transistor is not necessary.

Components such as transistors in the semiconductor device in FIG. 6A-1 can be regarded as including resistors and capacitors as illustrated in FIG. 6A-2. That is, in FIG. 6A-2, the transistor 160 and the capacitor 164 are each regarded as including a resistor and a capacitor. R1 and C1 denote the resistance and the capacitance of the capacitor 164, respectively. The resistance R1 corresponds to the resistance of the insulating layer included in the capacitor 164. R2 and C2 denote the resistance and the capacitance of the transistor 160, respectively. The resistance R2 corresponds to the resistance of the gate insulating layer at the time when the transistor 160 is turned on. The capacitance C2 corresponds to a so-called gate capacitance (capacitance formed between the gate electrode and the source or drain electrode, and capacitance formed between the gate electrode and the channel formation region).

A charge holding period (also referred to as a data holding period) is determined mainly by the off-state current of the transistor 162 under the conditions where gate leakage of the transistor 162 is sufficiently small and R1 and R2 satisfy R1≥ROS and R2≥ROS, where ROS is the resistance (also referred to as effective resistance) between the source electrode and the drain electrode in the case where the transistor 162 is turned off.

On the other hand, in the case where the conditions are not satisfied, it is difficult to secure a sufficient holding period even if the off-state current of the transistor 162 is sufficiently small. This is because a leakage current other than the off-state current of the transistor 162 (e.g., a leakage current generated between the source electrode and the gate electrode) is large. Accordingly, it can be said that the semiconductor device disclosed in this embodiment preferably satisfies the above relationships.

Meanwhile, it is desirable that C1 and C2 satisfy C1≥C2. This is because if C1 is large, variation in potential of the fifth wiring can be suppressed when the potential of the floating gate portion FG is controlled by the fifth wiring (e.g., at the time of reading).

When the above relationship is satisfied, a more favorable semiconductor device can be realized. Note that R1 and R2 depend on the gate insulating layers of the transistor 160 and the transistor 162. The same applies to C1 and C2. Therefore, the material, the thickness, and the like of the gate insulating layers are preferably set as appropriate to satisfy the above relationship.

In the semiconductor device described in this embodiment, the floating gate portion FG has a function similar to a floating gate of a floating gate transistor of a flash memory or the like, but the floating gate portion FG of this embodiment has a feature which is essentially different from that of the floating gate of the flash memory or the like. In the case of a flash memory, since a high voltage is applied to a control gate, it is necessary to keep a proper distance between cells in order to prevent the potential of the control gate from affecting a floating gate of an adjacent cell. This is one factor inhibiting higher integration of the semiconductor device. The factor is attributed to a basic principle of a flash memory, in which a tunneling current is generated by applying a high electric field.

Further, because of the above principle of a flash memory, deterioration of an insulating film proceeds and thus another problem that is the limit on the number of times of rewriting (approximately $10^4$ to $10^5$ times) arises.

The semiconductor device according to the disclosed invention is operated by switching of a transistor including an oxide semiconductor and does not use the above-described principle of charge injection by a tunneling current. That is, a high electric field for charge injection is not necessary, unlike a flash memory. Accordingly, it is not necessary to consider an influence of a high electric field from a control gate on an adjacent cell, and this facilitates higher integration.

Further, charge injection by a tunneling current is not employed, which means that there are no causes for deterioration of a memory cell. In other words, the semiconductor device according to the disclosed invention has higher durability and reliability than a flash memory.

In addition, the semiconductor device according to the disclosed invention is advantageous over a flash memory also in that a high electric field is not necessary and a large peripheral circuit (such as a booster circuit) is not necessary.

In the case where the relative permittivity $\in r1$ of the insulating layer forming C1 is different from the relative permittivity $\in r2$ of the insulating layer forming C2, it is easy to satisfy C1≥C2 while satisfying 2·S2≥S1 (desirably S2≥S1) where S1 is the area of C1 and S2 is the area of C2. Specifically, for example, a film including a high-k material such as hafnium oxide or a stack of a film including a high-k material such as hafnium oxide and a film including an oxide semiconductor is used for C1 so that $\in r1$ can be set to 10 or more, preferably 15 or more, and silicon oxide is used for C2 so that $\in r2$ can be set to 3 to 4.

A combination of such structures enables further higher integration of the semiconductor device according to the disclosed invention.

Note that an n-type transistor (n-channel transistor) in which electrons are majority carriers is used in the above description; it is needless to say that a p-type transistor (p-channel transistor) in which holes are majority carriers can be used instead of the n-type transistor.

As described above, a semiconductor device according to an embodiment of the disclosed invention has a nonvolatile memory cell including a writing transistor where a leakage current (off-state current) between a source and a drain in an off state is small, a reading transistor including a semiconductor material different from that of the writing transistor, and a capacitor.

It is desired that the off-state current of the writing transistor is 100 zA ($1\times10^{-19}$ A) or less, preferably 10 zA ($1\times10^{-20}$ A) or less, more preferably 1 zA ($1\times10^{-21}$ A) or less at ambient temperature (e.g., 25° C.). In the case of a general silicon semiconductor, it is difficult to achieve such a small off-state current as described above. However, in a transistor obtained by processing an oxide semiconductor under an appropriate condition, a small off-state current can be achieved. Therefore, a transistor including an oxide semiconductor is preferably used as the writing transistor.

In addition, a transistor including an oxide semiconductor has a small subthreshold swing (S value), so that the switching speed can be sufficiently increased even if the mobility is relatively low. Therefore, by using the transistor as the writing transistor, rising of a writing pulse supplied to the floating gate portion FG can be made very sharp. Further, because of such a small off-state current, the amount of charge held in the floating gate portion FG can be reduced. That is, by using a transistor including an oxide semiconductor as the writing transistor, rewriting of data can be performed at high speed.

There is no limitation on the off-state current of the reading transistor; it is desirable to use a transistor which operates at high speed in order to increase the reading speed. For example, a transistor with a switching speed of 1 nanosecond or less is preferably used as the reading transistor.

Data is written to the memory cell by turning on the writing transistor so that a potential is supplied to a node where one of the source electrode and the drain electrode of the writing transistor, one electrode of the capacitor, and the gate electrode of the reading transistor are electrically connected, and then turning off the writing transistor so that a predetermined amount of charge is held at the node. Here, the off-state current of the writing transistor is very small; thus, the charge supplied to the node is held for a long time. When the off-state current is, for example, substantially 0, it is possible that refresh operation needed for a conventional DRAM is not necessary or the frequency of refresh operation is significantly low (for example, about once a month or a year). Accordingly, power consumption of the semiconductor device can be reduced sufficiently.

Further, data can be directly rewritten by another writing of data to the memory cell. Therefore, erasing operation which is necessary for a flash memory or the like is not needed, and thus a decrease in operation speed due to erasing operation can be suppressed. In other words, high-speed operation of the semiconductor device can be realized. Moreover, a high voltage needed for writing or erasing in a conventional floating gate transistor is not necessary; thus, power consumption of the semiconductor device can be further reduced. The highest voltage applied to the memory cell according to this embodiment (the difference between the highest potential and the lowest potential applied to respective terminals of the memory cell at the same time) is 5 V or less, preferably 3 V or less, in each memory cell in the case where data of two stages (one bit) is written.

The memory cell provided in the semiconductor device according to the disclosed invention includes at least the writing transistor, the reading transistor, and the capacitor and can operate even when the area of the capacitor is small. Therefore, the area of each memory cell can be made sufficiently smaller than that in an SRAM which requires six transistors in each memory cell, and memory cells can be provided in the semiconductor device in high density.

In a conventional floating gate transistor, charges travel in a gate insulating film (tunnel insulating film) during writing operation, so that deterioration of the gate insulating film (tunnel insulating film) cannot be avoided. In contrast, in the memory cell according to an embodiment of the present invention, data is written by switching operation of the writing transistor; therefore, the deterioration of a gate insulating film, which is a conventional problem, can be resolved. This means that there is no limit on the number of times of writing in principle and writing durability is very high. For example, the current-voltage characteristics of the memory cell according to an embodiment of the present invention are not degraded even after data is written $1\times10^9$ or more times (one billion or more times).

Furthermore, in the case of using a transistor including an oxide semiconductor as the writing transistor of the memory cell, the current-voltage characteristics of the memory cell are not degraded even in an environment at a high temperature of, for example, 150° C. because the oxide semiconductor has a wide energy gap of 3.0 eV to 3.5 eV and extremely few thermally excited carriers.

As a result of diligent research, the present inventor and the like have first found that a transistor including an oxide semiconductor has excellent characteristics in that the characteristics thereof are not degraded even at a high temperature of 150° C. and the off-state current thereof is 100 zA or less which is extremely small. According to an embodiment of the disclosed invention, a semiconductor device having a novel feature is provided by using a transistor having such excellent characteristics as a writing transistor of a memory cell.

The structures, methods, and the like described in this embodiment can be combined as appropriate with any of the structures, methods, and the like described in other embodiments.

Embodiment 3

In this embodiment, an example of application of the semiconductor device described in the above embodiment will be described with reference to FIGS. 7A and 7B and FIGS. 8A to 8C.

Figure 7A:
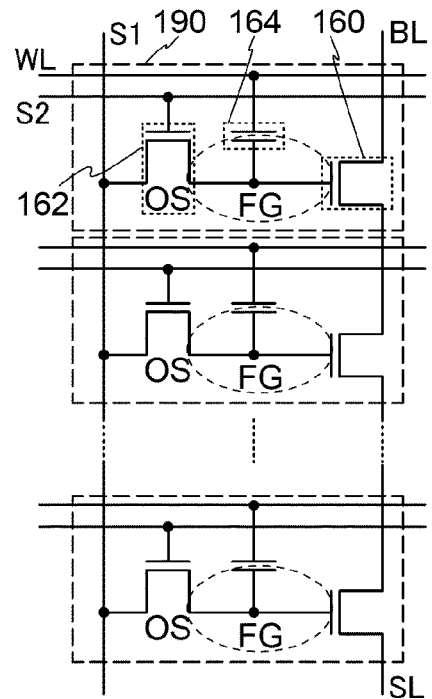
FIGS. 7A and 7B are circuit diagrams of a semiconductor device.
Figure 7B:
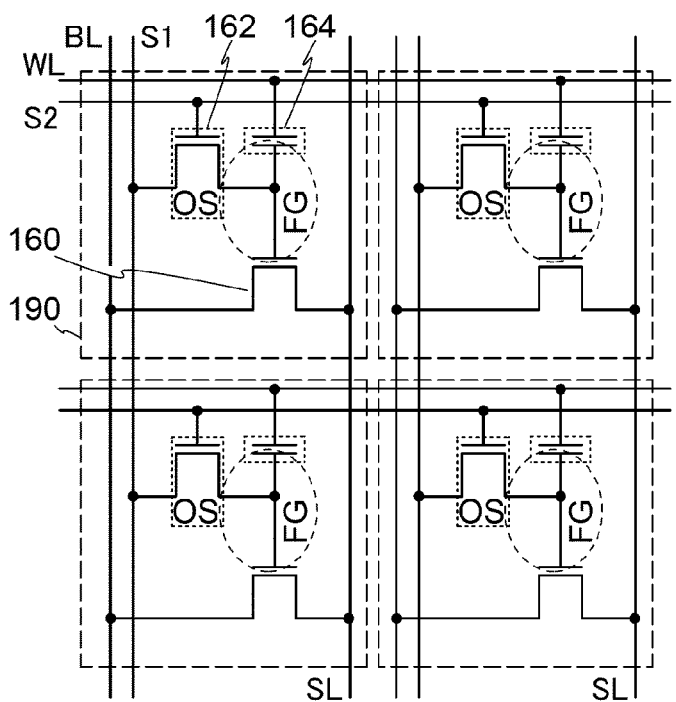

FIGS. 7A and 7B are circuit diagrams of semiconductor devices each including a plurality of semiconductor devices (hereinafter also referred to as memory cells 190) illustrated in FIG. 6A-1. FIG. 7A is a circuit diagram of a so-called NAND semiconductor device in which the memory cells 190 are connected in series, and FIG. 7B is a circuit diagram of a so-called NOR semiconductor device in which the memory cells 190 are connected in parallel.

The semiconductor device in FIG. 7A includes a source line SL, a bit line BL, a first signal line S1, a plurality of second signal lines S2, a plurality of word lines WL, and the plurality of memory cells 190. In FIG. 7A, one source line SL and one bit line BL are provided in the semiconductor device; however, an embodiment of the disclosed invention is not limited to this structure. A plurality of source lines SL and a plurality of bit lines BL may be provided.

In each of the memory cells 190, a gate electrode of the transistor 160, one of a source electrode and a drain electrode of the transistor 162, and one of electrodes of the capacitor 164 are electrically connected to one another. The first signal line S1 and the other of the source electrode and the drain electrode of the transistor 162 are electrically connected to each other, and the second signal line S2 and a gate electrode of the transistor 162 are electrically connected to each other. The word line WL and the other of the electrodes of the capacitor 164 are electrically connected to each other.

Further, the source electrode of the transistor 160 included in the memory cell 190 is electrically connected to the drain electrode of the transistor 160 in the adjacent memory cell 190. The drain electrode of the transistor 160 included in the memory cell 190 is electrically connected to the source electrode of the transistor 160 in the adjacent memory cell 190. Note that the drain electrode of the transistor 160 included in the memory cell 190 at one end of the plurality of memory cells connected in series is electrically connected to the bit line BL. The source electrode of the transistor 160 included in the memory cell 190 at the other end of the plurality of memory cells connected in series is electrically connected to the source line SL.

In the semiconductor device in FIG. 7A, writing operation and reading operation are performed for each row. The writing operation is performed as follows. A potential at which the transistor 162 is turned on is supplied to the second signal line S2 of a row where writing is to be performed, so that the transistor 162 of the row where writing is to be performed is turned on. Accordingly, a potential of the first signal line S1 is supplied to the gate electrode of the transistor 160 of the specified row, so that predetermined charge is applied to the gate electrode. Thus, data can be written to the memory cell of the specified row.

Further, the reading operation is performed as follows. First, a potential at which the transistor 160 is turned on regardless of charge of the gate electrode thereof is supplied to the word lines WL of the rows other than the row where reading is to be performed, so that the transistors 160 of the rows other than the row where reading is to be performed are turned on. Then, a potential (reading potential) at which an on state or an off state of the transistor 160 is determined depending on charge of the gate electrode of the transistor 160 is supplied to the word line WL of the row where reading is to be performed. After that, a constant potential is supplied to the source line SL so that a reading circuit (not illustrated) connected to the bit line BL is operated. Here, the plurality of transistors 160 between the source line SL and the bit line BL are turned on except the transistor 160 of the row where reading is to be performed; therefore, conductance between the source line SL and the bit line BL is determined by the state of the transistor 160 of the row where reading is to be performed. That is, the potential of the bit line BL read by the reading circuit depends on charge of the gate electrode of the transistor 160 of the row where reading is to be performed. In such a manner, data can be read from the memory cell of the specified row.

The semiconductor device in FIG. 7B includes a plurality of source lines SL, a plurality of bit lines BL, a plurality of first signal lines S1, a plurality of second signal lines S2, a plurality of word lines WL, and a plurality of memory cells 190. A gate electrode of the transistor 160, one of a source electrode and a drain electrode of the transistor 162, and one of electrodes of the capacitor 164 are electrically connected to one another. The source line SL and a source electrode of the transistor 160 are electrically connected to each other. The bit line BL and a drain electrode of the transistor 160 are electrically connected to each other. The first signal line S1 and the other of the source electrode and the drain electrode of the transistor 162 are electrically connected to each other, and the second signal line S2 and a gate electrode of the transistor 162 are electrically connected to each other. The word line WL and the other of the electrodes of the capacitor 164 are electrically connected to each other.

In the semiconductor device in FIG. 7B, writing operation and reading operation are performed for each row. The writing operation is performed in a manner similar to that of the semiconductor device in FIG. 7A. The reading operation is performed as follows. First, a potential at which the transistor 160 is turned off regardless of charge of the gate electrode thereof is supplied to the word lines WL of the rows other than the row where reading is to be performed, so that the transistors 160 of the rows other than the row where reading is to be performed are turned off. Then, a potential (reading potential) at which an on state or an off state of the transistor 160 is determined depending on charge of the gate electrode of the transistor 160 is supplied to the word line WL of the row where reading is to be performed. After that, a constant potential is supplied to the source line SL so that a reading circuit (not illustrated) connected to the bit line BL is operated. Here, conductance between the source line SL and the bit line BL is determined by the state of the transistor 160 of the row where reading is to be performed. That is, a potential of the bit line BL read by the reading circuit depends on charge of the gate electrode of the transistor 160 of the row where reading is to be performed. In such a manner, data can be read from the memory cell of the specified row.

Next, examples of reading circuits which can be used for the semiconductor devices in FIGS. 7A and 7B, or the like will be described with reference to FIGS. 8A to 8C.

Figure 8A:
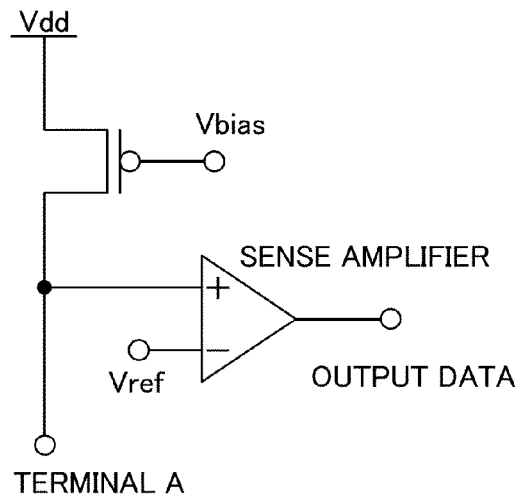
FIGS. 8A to 8C are circuit diagrams of a semiconductor device.

FIG. 8A illustrates an outline of the reading circuit. The reading circuit includes a transistor and a sense amplifier circuit.

At the time of reading data, a terminal A is connected to a bit line BL connected to a memory cell from which data is to be read. Further, a bias potential Vbias is applied to a gate electrode of the transistor so that a potential of the terminal A is controlled.

The resistance of the memory cell 190 varies depending on stored data. Specifically, when the transistor 160 of the selected memory cell 190 is turned on, the memory cell 190 has a low resistance, whereas when the transistor 160 of the selected memory cell 190 is turned off, the memory cell 190 has a high resistance.

When the memory cell has a high resistance, the potential of the terminal A is higher than a reference potential Vref and the sense amplifier circuit outputs a potential (data "1") corresponding to the potential of the terminal A. On the other hand, when the memory cell has a low resistance, the potential of the terminal A is lower than the reference potential Vref and the sense amplifier circuit outputs a potential (data "0") corresponding to the potential of the terminal A.

In this manner, by using the reading circuit, data can be read from the memory cell. Note that the reading circuit of this embodiment is one example. Another known circuit may be used. The reading circuit may further include a precharge circuit. Instead of the reference potential Vref, a reference bit line may be connected to the sense amplifier circuit.

Figure 8B:
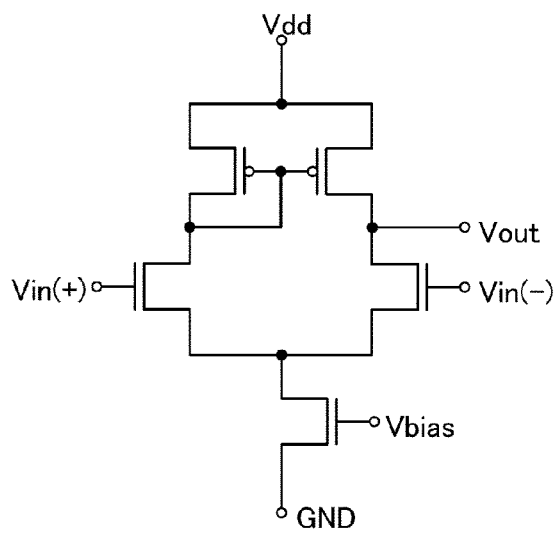

FIG. 8B illustrates a differential sense amplifier which is an example of sense amplifier circuits. The differential sense amplifier has input terminals Vin(+) and Vin(−) and an output terminal Vout, and amplifies a difference between Vin(+) and Vin(−). If Vin(+)>Vin(−), the output from Vout is relatively high, whereas if Vin(+)<Vin(−), the output from Vout is relatively low. In the case where the differential sense amplifier is used for the reading circuit, one of Vin(+) and Vin(−) is connected to the terminal A, and the reference potential Vref is supplied to the other of Vin(+) and Vin(−).

Figure 8C:
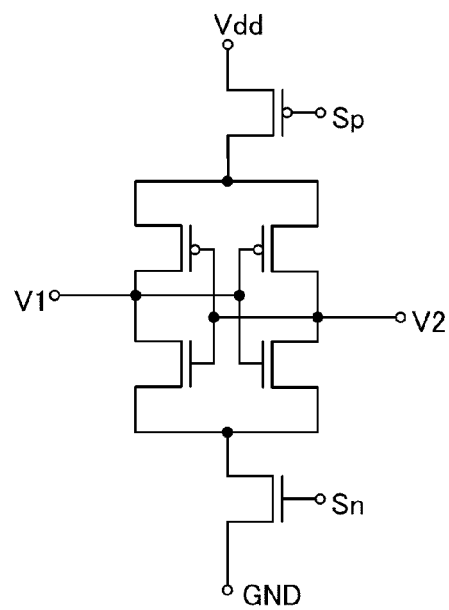

FIG. 8C illustrates a latch sense amplifier which is an example of sense amplifier circuits. The latch sense amplifier has input/output terminals V1 and V2 and input terminals for control signals Sp and Sn. First, the signal Sp is set high and the signal Sn is set low, and a power supply potential (Vdd) is interrupted. Then, potentials to be compared are supplied to V1 and V2. After that, the signals Sp is set low and the signal Sn is set high, and a power supply potential (Vdd) is supplied. If the potentials of V1 and V2 to be compared satisfy V1>V2, the output from V1 is high and the output from V2 is low, whereas if the potentials satisfy V1<V2, the output from V1 is low and the output from V2 is high. By utilizing such a relationship, the difference between V1 and V2 can be amplified. In the case where the latch sense amplifier is used for the reading circuit, one of V1 and V2 is connected to the terminal A and an output terminal through a switch, and the reference potential Vref is supplied to the other of V1 and V2.

The structures, methods, and the like described in this embodiment can be combined as appropriate with any of the structures, methods, and the like described in other embodiments.

Embodiment 4

In this embodiment, the cases where the semiconductor device described in the above embodiments is applied to electronic devices will be described with reference to FIGS. 9A to 9F. The cases where the above-described semiconductor device is applied to electronic devices such as a computer, a mobile phone set (also referred to as a mobile phone or a mobile phone device), a portable information terminal (including a portable game machine, an audio reproducing device, and the like), a digital camera, a digital video camera, electronic paper, a television set (also referred to as a television or a television receiver), and the like are described in this embodiment.

Figure 9A:
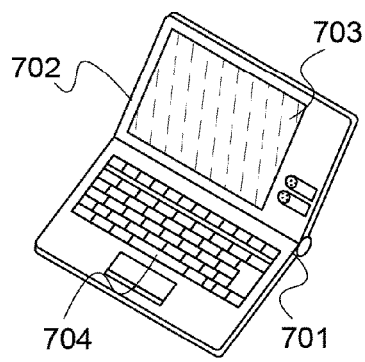
FIGS. 9A to 9F illustrate electronic devices each including a semiconductor device.

FIG. 9A illustrates a notebook personal computer, which includes a housing 701, a housing 702, a display portion 703, a keyboard 704, and the like. The semiconductor device described in the above embodiment is provided in the housing 701 and the housing 702. Thus, a notebook personal computer with sufficiently low power consumption, in which writing and reading of data can be performed at high speed and data can be stored for a long time, can be realized.

Figure 9D:
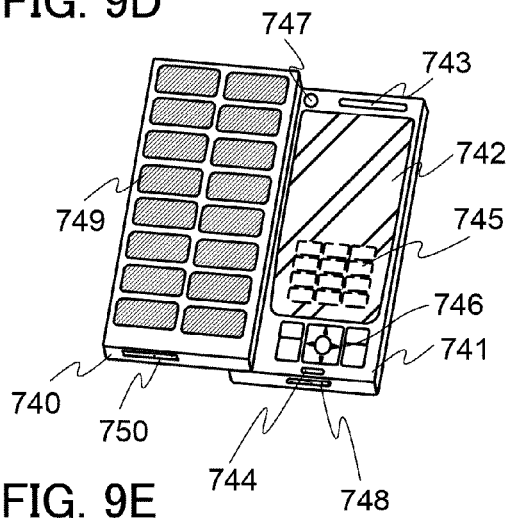
Figure 9B:
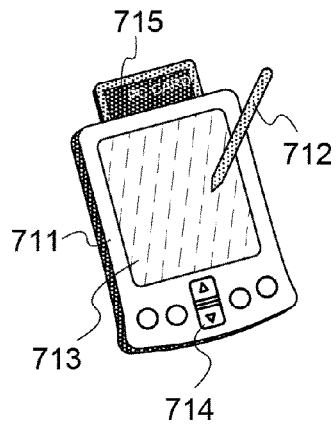

FIG. 9B illustrates a portable information terminal (PDA). A main body 711 is provided with a display portion 713, an external interface 715, operation buttons 714, and the like. Further, a stylus 712 for operation of the portable information terminal, or the like is provided. The semiconductor device described in the above embodiment is provided in the main body 711. Thus, a portable information terminal with sufficiently low power consumption, in which writing and reading of data can be performed at high speed and data can be stored for a long time, can be realized.

Figure 9E:
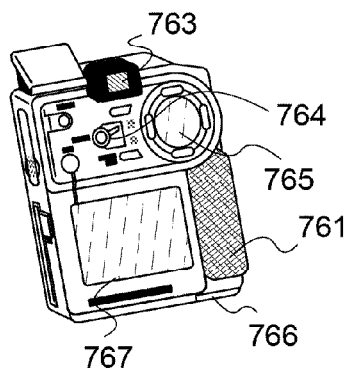
Figure 9C:
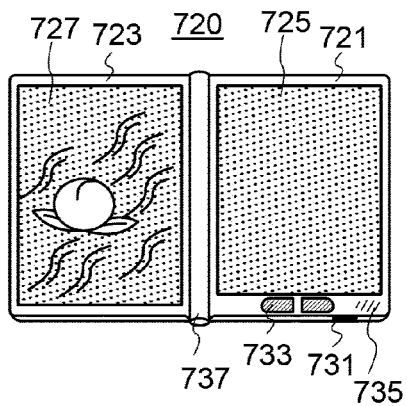

FIG. 9C illustrates an electronic book 720 incorporating electronic paper, which includes two housings, a housing 721 and a housing 723. The housing 721 and the housing 723 include a display portion 725 and a display portion 727, respectively. The housing 721 is connected to the housing 723 by a hinge 737, so that the electronic book 720 can be opened and closed using the hinge 737 as an axis. In addition, the housing 721 is provided with a power switch 731, operation keys 733, a speaker 735, and the like. The semiconductor device described in the above embodiment is provided in at least one of the housings 721 and 723. Thus, an electronic book with sufficiently low power consumption, in which writing and reading of data can be performed at high speed and data can be stored for a long time, can be realized.

FIG. 9D illustrates a mobile phone set, which includes two housings, a housing 740 and a housing 741. Moreover, the housings 740 and 741 in a state where they are developed as illustrated in FIG. 9D can be slid so that one is lapped over the other. Therefore, the size of the mobile phone set can be reduced, which makes the mobile phone set suitable for being carried around. The housing 741 includes a display panel 742, a speaker 743, a microphone 744, a pointing device 746, a camera lens 747, an external connection terminal 748, and the like. The housing 740 includes a solar cell 749 for charging the mobile phone set, an external memory slot 750, and the like. An antenna is incorporated in the housing 741. The semiconductor device described in the above embodiment is provided in at least one of the housings 740 and 741. Thus, a mobile phone set with sufficiently low power consumption, in which writing and reading of data can be performed at high speed and data can be stored for a long time, can be realized.

FIG. 9E illustrates a digital video camera, which includes a main body 761, a display portion 767, an eyepiece 763, an operation switch 764, a display portion 765, a battery 766, and the like. The semiconductor device described in the above embodiment is provided in the main body 761. Thus, a digital video camera with sufficiently low power consumption, in which writing and reading of data can be performed at high speed and data can be stored for a long time, can be realized.

Figure 9F:
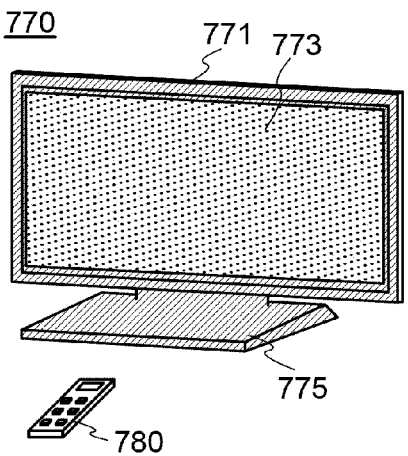

FIG. 9F is a television set 770, which includes a housing 771, a display portion 773, a stand 775, and the like. The television set 770 can be operated with a switch included in the housing 771 or with a remote controller 780. The semiconductor device described in the above embodiment is mounted in the housing 771 and the remote controller 780. Thus, a television set with sufficiently low power consumption, in which writing and reading of data can be performed at high speed and data can be stored for a long time, can be realized.

As described above, the electronic devices described in this embodiment each include the semiconductor device according to the above embodiment. Therefore, an electronic device with low power consumption can be realized.

Example 1

In this example, results of measuring the off-state current of a transistor including a purified oxide semiconductor will be described.

Figure 10:
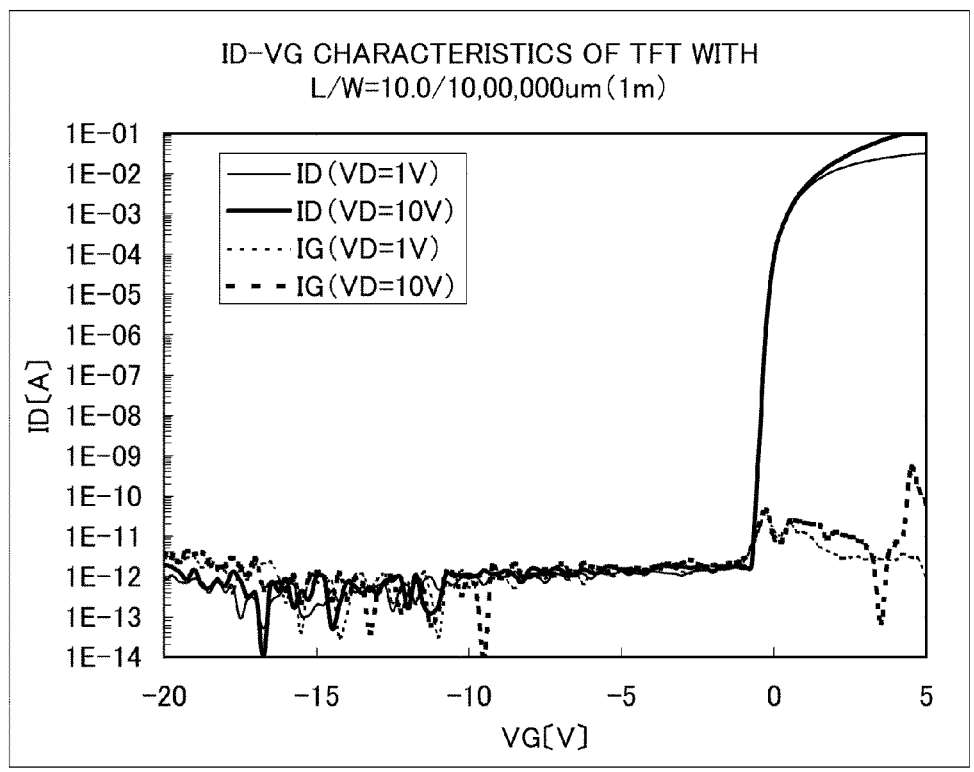
FIG. 10 is a graph showing characteristics of a transistor including an oxide semiconductor.

In this example, a transistor was manufactured using a purified oxide semiconductor according to Embodiment 1. First, a transistor with a channel width W of 1 m, which is sufficiently wide, was prepared in consideration of a very small off-state current of a transistor including a purified oxide semiconductor, and the off-state current was measured. FIG. 10 shows the results of measuring the off-state current of the transistor with a channel width W of 1 m. In FIG. 10, the horizontal axis shows a gate voltage VG and the vertical axis shows a drain current ID. In the case where the drain voltage VD is +1 V or +10 V and the gate voltage VG is within the range of −5 V to −20 V, the off-state current of the transistor is found to be smaller than or equal to $1\times10^{-13}$ A which is the detection limit. In addition, the off-state current of the transistor is found to be 1 aA/μm ($1\times10^{-18}$ A/μm) or less.

Next, the results of more accurately measuring the off-state current of the transistor including a purified oxide semiconductor will be described. As described above, the off-state current of the transistor including a purified oxide semiconductor is found to be smaller than or equal to $1\times10^{-13}$ A which is the detection limit of measurement equipment. Here, the results of measuring more accurate off-state current (a value smaller than or equal to the detection limit of measurement equipment in the above measurement), with the use of an element for characteristic evaluation, will be described.

First, the element for characteristic evaluation which is used in a method for measuring current will be described with reference to FIG. 11.

Figure 11:
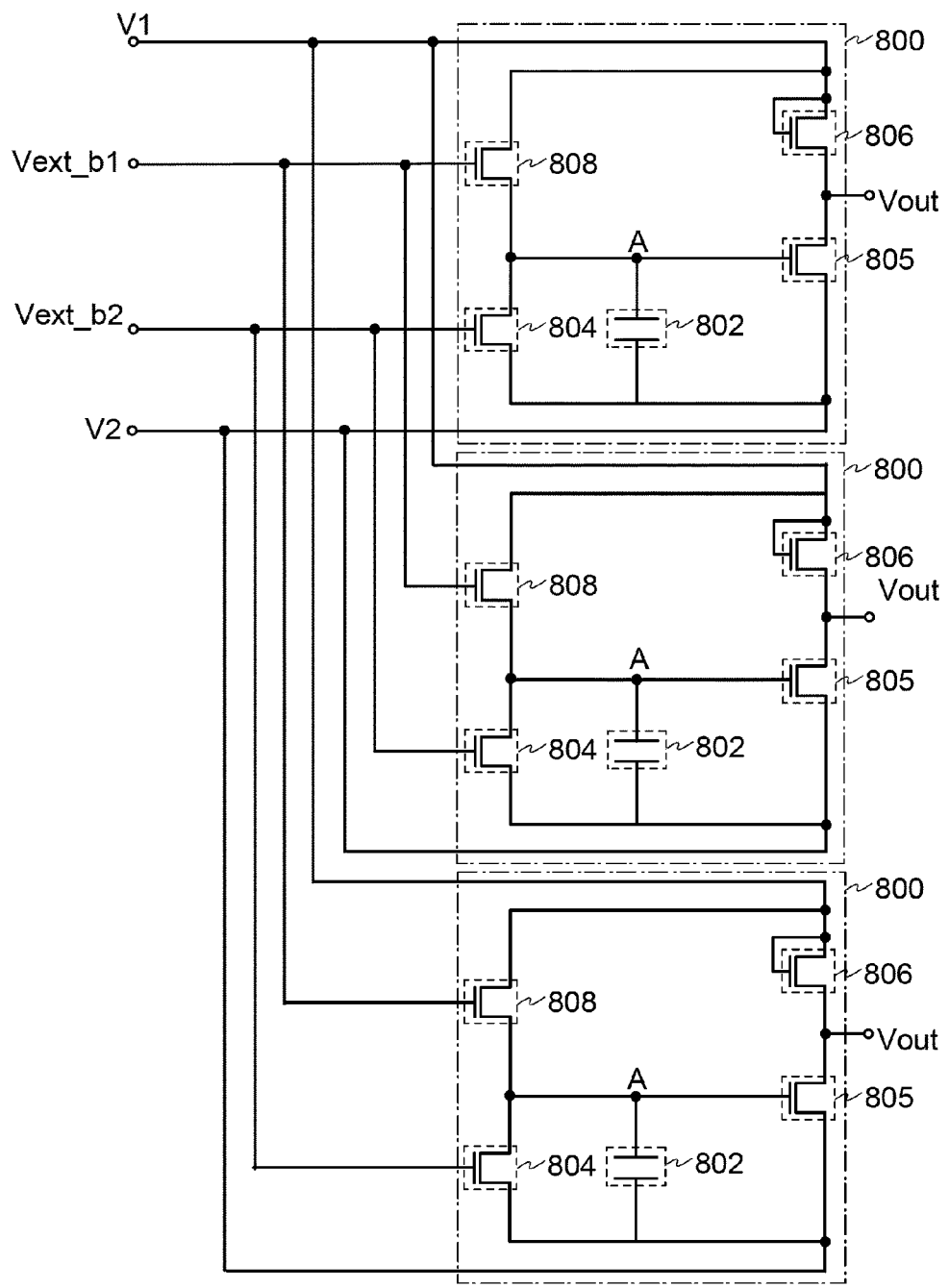
FIG. 11 is a circuit diagram for evaluating characteristics of a transistor including an oxide semiconductor.

In the element for characteristic evaluation in FIG. 11, three measurement systems 800 are connected in parallel. The measurement systems 800 each include a capacitor 802, a transistor 804, a transistor 805, a transistor 806, and a transistor 808. A transistor which is manufactured in accordance with Embodiment 1 is used as each of the transistor 804 and the transistor 808.

In the measurement system 800, one of a source terminal and a drain terminal of the transistor 804, one of terminals of the capacitor 802, and one of a source terminal and a drain terminal of the transistor 805 are connected to a power source (for supplying V2). The other of the source terminal and the drain terminal of the transistor 804, one of a source terminal and a drain terminal of the transistor 808, the other of the terminals of the capacitor 802, and a gate terminal of the transistor 805 are connected to one another. The other of the source terminal and the drain terminal of the transistor 808, one of a source terminal and a drain terminal of the transistor 806, and a gate terminal of the transistor 806 are connected to a power source (for supplying V1). The other of the source terminal and the drain terminal of the transistor 805 and the other of the source terminal and the drain terminal of the transistor 806 are connected to each other and connected to an output terminal.

Note that a potential Vext_b2 for controlling whether to turn on or off the transistor 804 is supplied to the gate terminal of the transistor 804, and a potential Vext_b1 for controlling whether to turn on or off the transistor 808 is supplied to the gate terminal of the transistor 808. A potential Vout is output from the output terminal.

Next, a method for measuring a current with the use of the above measurement system is described.

First, an initialization period in which a potential difference is generated to measure the off-state current will be briefly described. In the initialization period, the potential Vext_b1 for turning on the transistor 808 is input to the gate terminal of the transistor 808, and a potential V1 is supplied to a node A that is connected to the other of the source terminal and the drain terminal of the transistor 804 (that is, the node connected to one of the source terminal and the drain terminal of the transistor 808, the other of the terminals of the capacitor 802, and the gate terminal of the transistor 805). Here, the potential V1 is, for example, a high potential. In addition, the transistor 804 is turned off.

After that, the potential Vext_b1 for turning off the transistor 808 is input to the gate terminal of the transistor 808, so that the transistor 808 is turned off. After the transistor 808 is turned off, the potential V1 is set to a low potential. Still, the transistor 804 is turned off. The potential V2 is equal to the potential V1. Thus, the initialization period is completed. When the initialization period is completed, a potential difference is generated between the node A and one of the source terminal and the drain terminal of the transistor 804. In addition, a potential difference is generated between the node A and the other of the source terminal and the drain terminal of the transistor 808. Accordingly, a small amount of electric charge flows through the transistor 804 and the transistor 808. That is, the off-state current is generated.

Next, a measurement period of the off-state current will be briefly described. In the measurement period, the potential (that is, V2) of one of the source terminal and the drain terminal of the transistor 804 and the potential (that is, V1) of the other of the source terminal and the drain terminal of the transistor 808 are fixed to a low potential. On the other hand, the potential of the node A is not fixed (the node A is in a floating state) in the measurement period. Accordingly, charge flows through the transistor 804, and the amount of charge held at the node A changes over time. The potential of the node A changes depending on the change in the amount of charge held at the node A. That is, the output potential Vout of the output terminal also changes.

Figure 12:
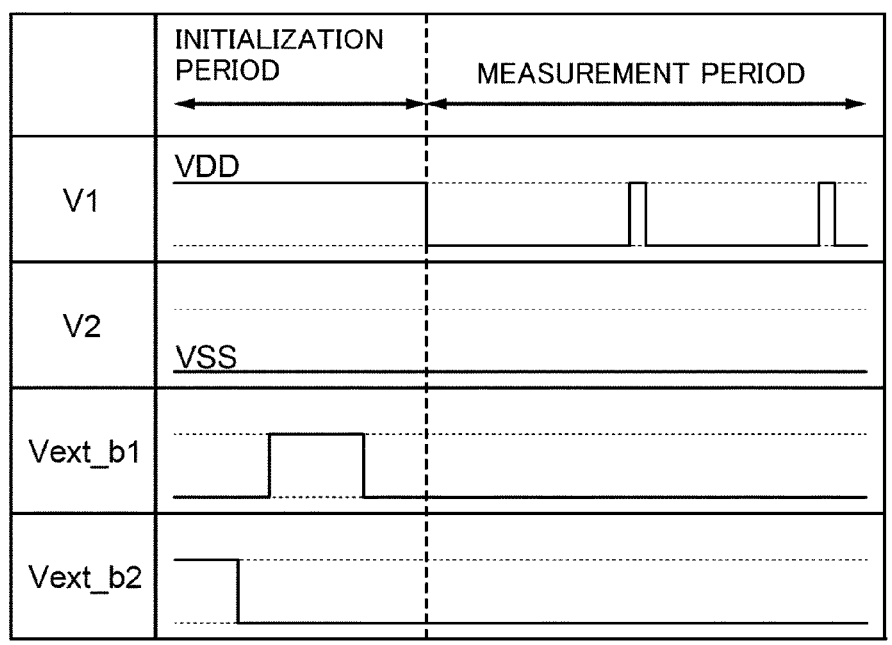
FIG. 12 is a timing chart for evaluating characteristics of a transistor including an oxide semiconductor.

FIG. 12 shows details (a timing chart) of the relationship between potentials in the initialization period in which the potential difference is generated and those in the following measurement period.

In the initialization period, first, the potential Vext_b2 is set to a potential (a high potential) at which the transistor 804 is turned on. Therefore, the potential of the node A becomes V2, that is, a low potential (VSS). After that, the potential Vext_b2 is set to a potential (a low potential) at which the transistor 804 is turned off, so that the transistor 804 is turned off. Next, the potential Vext_b1 is set to a potential (a high potential) at which the transistor 808 is turned on. Accordingly, the potential of the node A becomes V1, that is, a high potential (VDD). Then, Vext_b1 is set to a potential at which the transistor 808 is turned off, which places the node A in a floating state and finishes the initialization period.

In the measurement period after the initialization period, the potential V1 and the potential V2 are set such that charge flows to the node A or charge flows out of the node A. Here, the potential V1 and the potential V2 are set to a low potential (VSS). Note that at the time when the output potential Vout is measured, it is necessary to operate an output circuit and thus temporarily make V1 a high potential (VDD) in some cases. Note that the period in which V1 is a high potential (VDD) is made short to such a degree that the measurement is not influenced.

When the potential difference is generated and the measurement period is started as described above, the amount of charge held at the node A changes over time, which causes the potential of the node A to change. This means that the potential of the gate terminal of the transistor 805 changes; thus, the output potential Vout of the output terminal also changes over time.

A method for calculating the off-state current on the basis of the obtained output potential Vout is described below.

The relationship between a potential $V_A$ of the node A and the output potential Vout is obtained before calculation of the off-state current. With this, the potential $V_A$ of the node A can be obtained using the output potential Vout. In accordance with the above relationship, the potential $V_A$ of the node A can be expressed as a function of the output potential Vout by the following equation.

$$V_A = F(Vout) \quad [\text{Formula 1}]$$

Charge $Q_A$ of the node A can be expressed by the following equation with the use of the potential $V_A$ of the node A, capacitance $C_A$ connected to the node A, and a constant (const). Here, the capacitance $C_A$ connected to the node A is the sum of the capacitance of the capacitor 802 and other capacitance.

$$Q_A = C_A V_A + \text{const} \quad [\text{Formula 2}]$$

Current $I_A$ of the node A is a time derivative of charge which flows to the node A (or charge which flows out of the node A), and is thus expressed by the following equation.

$$I_A = \frac{\Delta Q_A}{\Delta t} = \frac{C_A \cdot \Delta F(Vout)}{\Delta t} \quad [\text{Formula 3}]$$

In this manner, the current $I_A$ of the node A can be obtained from the capacitance $C_A$ connected to the node A and the output potential Vout of the output terminal.

In accordance with the above method, it is possible to measure leakage current (off-state current) which flows between a source and a drain of a transistor in an off state.

In this example, the transistor 804 and the transistor 808 were manufactured using a purified oxide semiconductor. The ratio of the channel length (L) to the channel width (W) of the transistors was L/W=1/5. In addition, in the measurement systems 800 which are arranged in parallel, the capacitances of the capacitors 802 were 100 fF, 1 pF, and 3 pF.

Note that VDD was 5 V and VSS was 0 V in the measurement of this example. In the measurement period, Vout was measured while the potential V1 was basically set to VSS and changed to VDD for 100 msec at intervals of 10 sec to 300 sec. Δt which was used in calculation of current I which flows through the element was 30000 sec.

Figure 13:
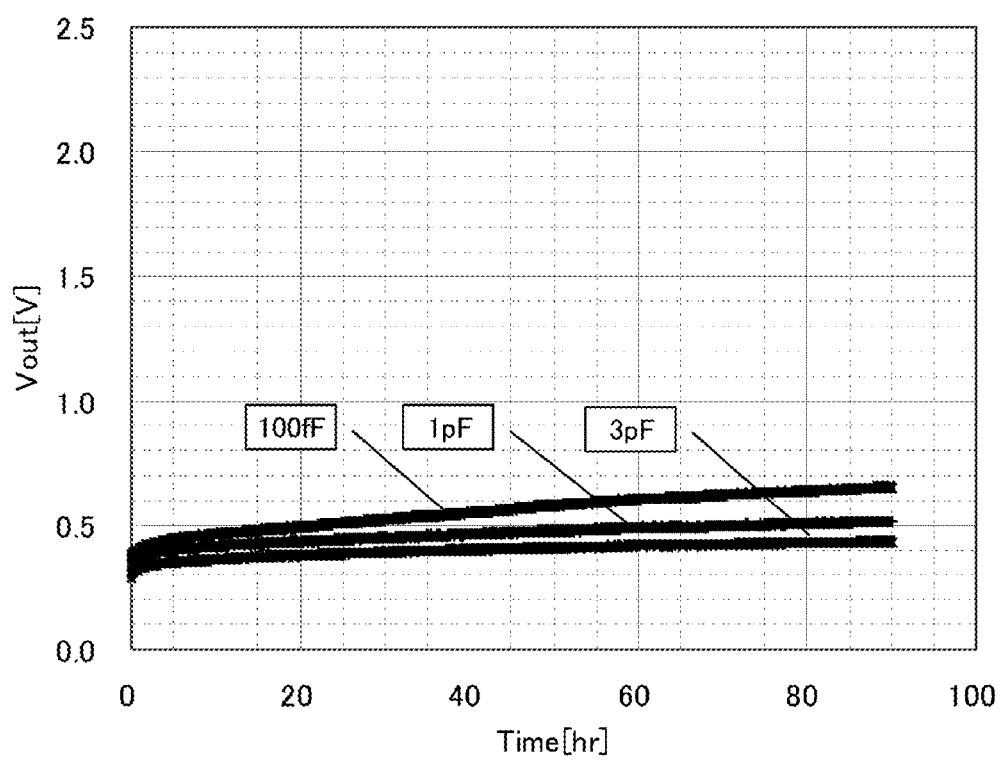
FIG. 13 is a graph showing characteristics of a transistor including an oxide semiconductor.

FIG. 13 shows the relationship between elapsed time Time in the above current measurement and the output potential Vout. It can be confirmed that the potential changes over time.

Figure 14:
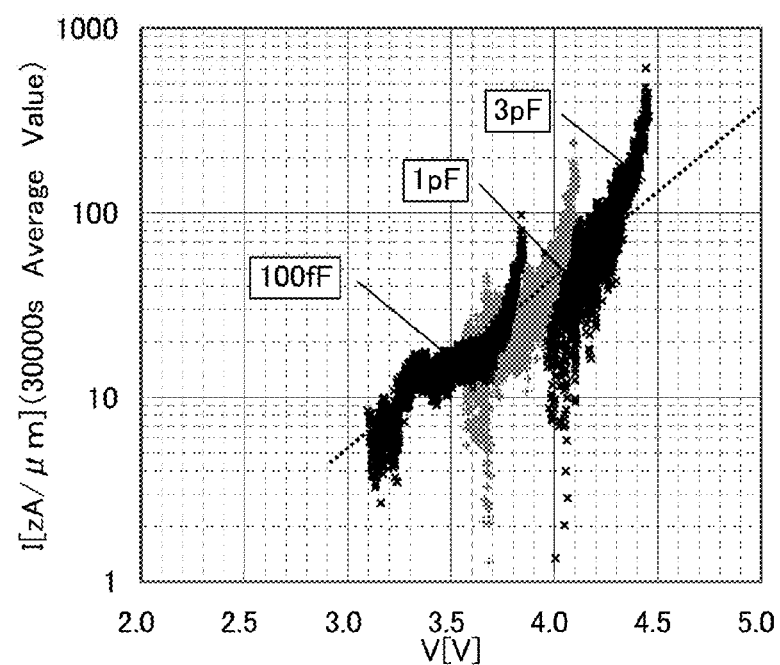
FIG. 14 is a graph showing characteristics of a transistor including an oxide semiconductor.

FIG. 14 shows the off-state current which is calculated in the above current measurement. Note that FIG. 14 shows the relationship between a source-drain voltage V and an off-state current I. It is found from FIG. 14 that the off-state current is about 40 zA/μm under the condition where the source-drain voltage is 4 V. It is also found that the off-state current is smaller than or equal to 10 zA/μm under the condition where the source-drain voltage is 3.1 V. Note that 1 zA represents $10^{-21}$ A.

As described above, it is confirmed from this example that the off-state current of a transistor including a purified oxide semiconductor is sufficiently small.

Example 2

The number of times the semiconductor device according to an embodiment of the disclosed invention can rewrite data was examined. In this example, the examination results will be described with reference to FIG. 15.

A semiconductor device used for the examination is the semiconductor device having the circuit configuration in FIG. 6A-1. Here, an oxide semiconductor was used for a transistor corresponding to the transistor 162, and a capacitor with a capacitance of 0.33 pF was used as a capacitor corresponding to the capacitor 164.

The examination was performed by comparing the initial memory window width and the memory window width after storing and writing data were repeated a predetermined number of times. Data was stored and written by applying 0 V or 5 V to a wiring corresponding to the third wiring in FIG. 6A-1 and applying 0 V or 5 V to a wiring corresponding to the fourth wiring. When the potential of the wiring corresponding to the fourth wiring is 0 V, the transistor (writing transistor) corresponding to the transistor 162 is turned off; thus, a potential supplied to a floating gate portion FG is held. When the potential of the wiring corresponding to the fourth wiring is 5 V, the transistor corresponding to the transistor 162 is turned on; thus, a potential of the wiring corresponding to the third wiring is supplied to the floating gate portion FG.

The memory window width is one of indicators of characteristics of a memory device. Here, the memory window width represents the shift amount ΔVcg in curves (Vcg–Id curves) between different memory states, which show the relationship between the potential Vcg of a wiring corresponding to the fifth wiring and a drain current Id of a transistor (reading transistor) corresponding to the transistor 160. The different memory states mean a state where 0 V is applied to the floating gate portion FG (hereinafter referred to as a low state) and a state where 5 V is applied to the floating gate portion FG (hereinafter referred to as a high state). That is, the memory window width can be checked by sweeping the potential Vcg in the low state and in the high state.

Figure 15:
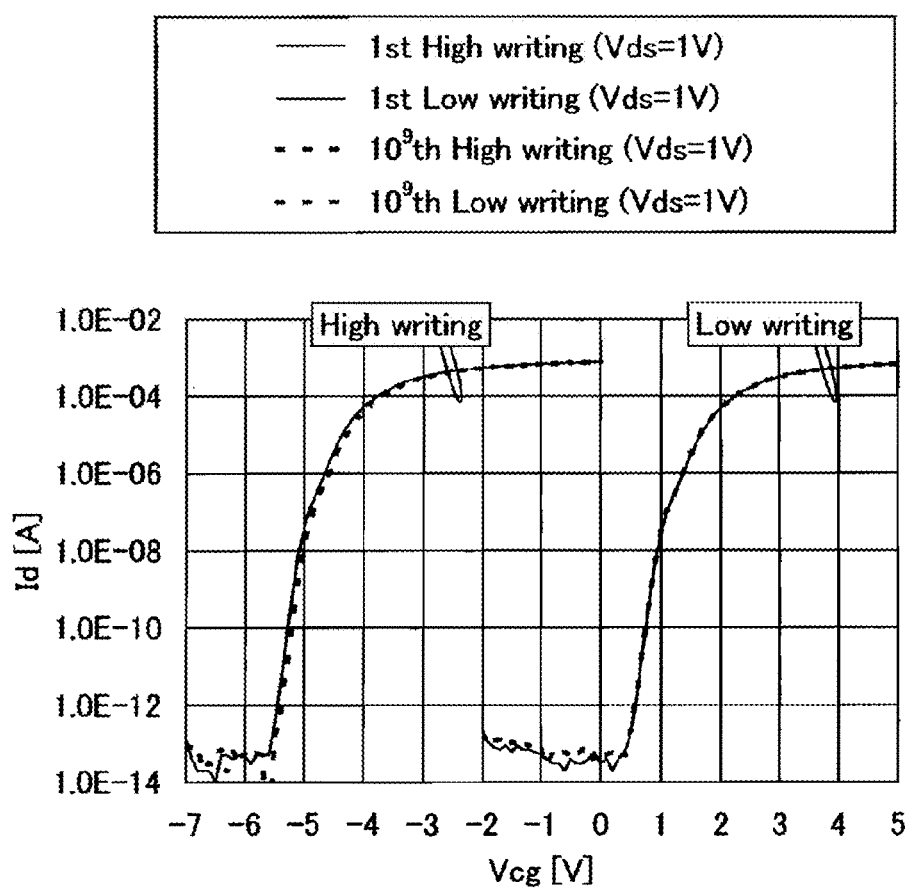
FIG. 15 is a graph showing examination results of memory window widths.

FIG. 15 shows the examination results of the initial memory window width and the memory window width after writing was performed $1 \times 10^9$ times. Note that in FIG. 15, the horizontal axis shows Vcg (V) and the vertical axis shows Id (A). It can be confirmed from FIG. 15 that there is no difference between the memory window widths before and after writing is performed $1\times10^9$ times. The fact that there is no difference between the memory window widths before and after writing is performed $1\times10^9$ times means that the semiconductor device is not deteriorated at least during the writing.

As described above, the characteristics of the semiconductor device according to an embodiment of the disclosed invention do not change even when storing and writing data are repeated $10^9$ times, and the writing durability thereof is very high. In other words, it can be said that a semiconductor device with significantly high reliability can be realized according to an embodiment of the disclosed invention.

This application is based on Japanese Patent Application serial no. 2010-007421 filed with Japan Patent Office on Jan. 15, 2010, the entire contents of which are hereby incorporated by reference.

The invention claimed is:

1. A semiconductor device comprising:
   a first transistor comprising:
      a channel region including a first semiconductor material;
      impurity regions between which the channel region is sandwiched;
      a first gate insulating layer over the channel region;
      a conductive layer including a first gate electrode over the first gate insulating layer; and
      a first source electrode and a first drain electrode electrically connected to the impurity regions;
   a second transistor comprising:
      a second source electrode and a second drain electrode wherein the conductive layer includes one of the second source electrode and the second drain electrode and wherein the other of the second source electrode and the second drain electrode is separated from the first gate electrode;
      a semiconductor layer including a second semiconductor material and electrically connected to the second source electrode and the second drain electrode;
      a second gate insulating layer over the semiconductor layer; and
      a second gate electrode over the second gate insulating layer; and
   an insulating layer in direct contact with the impurity regions and the semiconductor layer.

2. The semiconductor device according to claim 1, wherein the first semiconductor material is different from the second semiconductor material.

3. The semiconductor device according to claim 1, wherein the second semiconductor material comprises an oxide semiconductor material.

4. The semiconductor device according to claim 1, wherein the second semiconductor material has an energy gap of more than 3 eV.

5. The semiconductor device according to claim 1, wherein a switching speed of the first transistor is higher than a switching speed of the second transistor.

6. The semiconductor device according to claim 1, wherein an off-state current of the second transistor is smaller than an off-state current of the first transistor.

7. The semiconductor device according to claim 1, wherein the semiconductor device is incorporated into one selected from the group consisting of a personal computer, a portable information terminal, an electronic book, a mobile phone, a digital video camera, and a television set.

8. The semiconductor device according to claim 1, wherein the conductive layer is a single layer.

9. A semiconductor device comprising:
   a first transistor comprising:
      a channel region including a first semiconductor material;
      impurity regions between which the channel region is sandwiched;
      a first gate insulating layer over the channel region;
      a conductive layer including a first gate electrode over the first gate insulating layer; and
      a first source electrode and a first drain electrode electrically connected to the impurity regions;
   a second transistor comprising:
      a second source electrode and a second drain electrode wherein the conductive layer includes one of the second source electrode and the second drain electrode and wherein the other of the second source electrode and the second drain electrode is separated from the first gate electrode;
      a semiconductor layer including a second semiconductor material and electrically connected to the second source electrode and the second drain electrode;
      a second gate insulating layer over the semiconductor layer; and
      a second gate electrode over the second gate insulating layer;
   a capacitor comprising:
      one of the second source electrode and the second drain electrode;
      the second gate insulating layer; and
      a capacitor electrode over the second gate insulating layer; and
   an insulating layer in direct contact with the impurity regions and the semiconductor layer.

10. The semiconductor device according to claim 9, wherein the first semiconductor material is different from the second semiconductor material.

11. The semiconductor device according to claim 9, wherein the second semiconductor material comprises an oxide semiconductor material.

12. The semiconductor device according to claim 9, wherein the second semiconductor material has an energy gap of more than 3 eV.

13. The semiconductor device according to claim 9, wherein a switching speed of the first transistor is higher than a switching speed of the second transistor.

14. The semiconductor device according to claim 9, wherein an off-state current of the second transistor is smaller than an off-state current of the first transistor.

15. The semiconductor device according to claim 9, wherein the semiconductor device is incorporated into one selected from the group consisting of a personal computer, a portable information terminal, an electronic book, a mobile phone, a digital video camera, and a television set.

16. The semiconductor device according to claim 9, wherein the conductive layer is a single layer.

17. A semiconductor device comprising:
   a first transistor comprising:
      a channel region including a first semiconductor material;
      impurity regions between which the channel region is sandwiched;
      a first gate insulating layer over the channel region;
      a conductive layer including a first gate electrode over the first gate insulating layer; and a first source electrode and a first drain electrode electrically connected to the impurity regions;

a second transistor comprising:

a second source electrode and a second drain electrode wherein the conductive layer includes one of the second source electrode and the second drain electrode and wherein the other of the second source electrode and the second drain electrode is separated from the first gate electrode;

a semiconductor layer including a second semiconductor material and electrically connected to the second source electrode and the second drain electrode;

a second gate insulating layer over the semiconductor layer; and a second gate electrode over the second gate insulating layer; and an insulating layer in direct contact with the impurity regions and the semiconductor layer, wherein each of the first transistor and the second transistor is a top gate transistor, and wherein the insulating layer is configured to surround the first transistor.

18. The semiconductor device according to claim 17, wherein the first semiconductor material is different from the second semiconductor material.

19. The semiconductor device according to claim 17, wherein the second semiconductor material comprises an oxide semiconductor material.

20. The semiconductor device according to claim 17, wherein the second semiconductor material has an energy gap of more than 3 eV.

21. The semiconductor device according to claim 17, wherein a switching speed of the first transistor is higher than a switching speed of the second transistor.

22. The semiconductor device according to claim 17, wherein an off-state current of the second transistor is smaller than an off-state current of the first transistor.

23. The semiconductor device according to claim 17, wherein the semiconductor device is incorporated into one selected from the group consisting of a personal computer, a portable information terminal, an electronic book, a mobile phone, a digital video camera, and a television set.

24. The semiconductor device according to claim 17, wherein the conductive layer is a single layer.

* * * * *